US010056396B2

(12) United States Patent
Mukai

(10) Patent No.: US 10,056,396 B2
(45) Date of Patent: Aug. 21, 2018

(54) METHOD OF MANUFACTURING SEMICONDUCTOR DEVICE AND SEMICONDUCTOR DEVICE

(71) Applicant: Renesas Electronics Corporation, Tokyo (JP)

(72) Inventor: Hiroki Mukai, Hitachinaka (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/647,548

(22) Filed: Jul. 12, 2017

(65) Prior Publication Data

US 2017/0317094 A1 Nov. 2, 2017

Related U.S. Application Data

(62) Division of application No. 15/242,826, filed on Aug. 22, 2016, now Pat. No. 9,735,166.

(30) Foreign Application Priority Data

Aug. 26, 2015 (JP) ................................. 2015-166770

(51) Int. Cl.
| | |
|---|---|
| *H01L 29/78* | (2006.01) |
| *H01L 27/11521* | (2017.01) |
| *H01L 29/423* | (2006.01) |
| *H01L 29/66* | (2006.01) |
| *H01L 29/788* | (2006.01) |
| *H01L 21/28* | (2006.01) |
| *H01L 21/311* | (2006.01) |
| *H01L 27/11524* | (2017.01) |

(Continued)

(52) U.S. Cl.
CPC .. *H01L 27/11521* (2013.01); *H01L 21/28273* (2013.01); *H01L 21/31111* (2013.01); *H01L 21/31144* (2013.01); *H01L 27/11524* (2013.01); *H01L 29/42324* (2013.01); *H01L 29/42328* (2013.01); *H01L 29/66553* (2013.01); *H01L 29/66825* (2013.01); *H01L 29/788* (2013.01); *H01L 21/0337* (2013.01); *H01L 21/32139* (2013.01)

(58) Field of Classification Search
None
See application file for complete search history.

(56) References Cited

U.S. PATENT DOCUMENTS

| | | |
|---|---|---|
| 6,727,144 B2 | 4/2004 | Hashimoto |
| 6,773,989 B2 | 8/2004 | Wang |
| 6,847,068 B2 | 1/2005 | Chuang et al. |

(Continued)

FOREIGN PATENT DOCUMENTS

JP 2008-251825 A 10/2008

*Primary Examiner* — Benjamin Sandvik
(74) *Attorney, Agent, or Firm* — Sughrue Mion, PLLC

(57) ABSTRACT

A semiconductor device having good characteristics without variation and a method of manufacturing the same are provided. A part of a conductive layer for a floating gate is removed by using a spacer insulating film, a first insulating film, and a second insulating film as a mask. A floating gate having a tip portion is formed from the conductive layer for the floating gate, and a part of an insulating layer for a gate insulating film is exposed from the floating gate. The tip portion of the floating gate is further exposed by selectively removing the second insulating film among the second insulating film, the insulating layer for the gate insulating film, and the spacer insulating film.

3 Claims, 20 Drawing Sheets

(51) Int. Cl.
*H01L 21/033* (2006.01)
*H01L 21/3213* (2006.01)

(56) References Cited

U.S. PATENT DOCUMENTS

| | | |
|---|---|---|
| 6,967,372 B2 | 11/2005 | Chern |
| 2003/0235951 A1 | 12/2003 | Hashimoto |
| 2005/0095785 A1 | 5/2005 | Jeon et al. |
| 2008/0099789 A1 | 5/2008 | Kotov et al. |
| 2008/0242026 A1 | 10/2008 | Matsuzaki et al. |
| 2009/0096015 A1 | 4/2009 | Io |
| 2017/0062448 A1 | 3/2017 | Kitajima |

METHOD OF MANUFACTURING SEMICONDUCTOR DEVICE AND SEMICONDUCTOR DEVICE

This application is a Divisional of U.S. patent application Ser. No. 15/242,826, filed on Aug. 22, 2016, which claims priority from Japanese Patent Application No. 2015-166770 filed with the Japan Patent Office on Aug. 26, 2015, the entire contents of which are hereby incorporated by reference.

BACKGROUND OF THE INVENTION

Field of the Invention

The present invention relates to a method of manufacturing a semiconductor device and a semiconductor device.

Description of the Background Art

A semiconductor device including a non-volatile memory having a floating gate structure has been known. For example, Japanese Patent Laying-Open No. 2008-251825 discloses a non-volatile semiconductor storage device including a non-volatile memory having a floating gate structure of a split gate type. Patent Literature 1 discloses a method of exposing a tip portion of a floating gate by removing a first spacer.

SUMMARY OF THE INVENTION

In order to suppress variation in characteristics of a non-volatile memory such as erasing characteristics, variation in width of a tip portion opposed to a control gate should be suppressed by reliably removing all of the first spacer. In a method of manufacturing a non-volatile memory having a floating gate structure disclosed in Patent Literature 1, however, the first spacer and a gate oxide film are made of the same material. Therefore, it is difficult to increase a difference between an etching rate for the first spacer and an etching rate for the gate oxide film. In an attempt to reliably remove all of the first spacer for suppressing variation in width of the tip portion opposed to the control gate, the gate oxide film under the floating gate is laterally removed. Therefore, with the manufacturing method disclosed in Patent Literature 1, a shape of the gate oxide film deviates from the shape as designed and characteristics of the non-volatile memory are degraded.

Other objects and novel features will become apparent from the description herein and the accompanying drawings.

A method of manufacturing a semiconductor device according to one embodiment includes a process below. A floating gate having a tip portion is formed from a conductive layer for a floating gate and a part of an insulating layer for a gate insulating film is exposed from the floating gate by removing a part of the conductive layer for the floating gate by using a spacer insulating film, a first insulating film, and a second insulating film as a mask. The tip portion of the floating gate is further exposed by selectively removing the second insulating film among the second insulating film, the insulating layer for the gate insulating film, and the spacer insulating film.

According to the method of manufacturing a semiconductor device according to one embodiment, a semiconductor device having good characteristics without variation and a method of manufacturing the same can be provided.

DESCRIPTION OF THE PREFERRED EMBODIMENTS

First Embodiment

A configuration of a semiconductor device MCP in the present embodiment will be described with reference to FIGS. 1 to 4.

Figure 1:
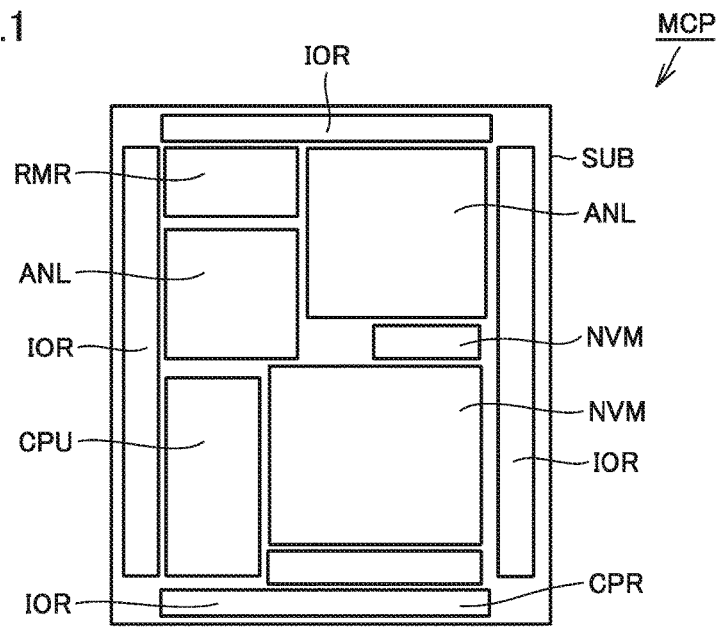
FIG. 1 is a schematic plan view of a semiconductor device according to a first embodiment.

Referring to FIG. 1, semiconductor device MCP in the present embodiment may be, for example, an embedded microcomputer on which a non-volatile memory having a floating gate structure is mounted. Semiconductor device MCP has, on a semiconductor substrate SUB, a central processing unit area CPU, an analog circuit area ANL, a random access memory area RMR, a non-volatile memory area NVM, a charge pump area CPR, and an input and output area IOR. A plurality of flash memories having a floating gate structure may be formed in non-volatile memory area NVM.

Figure 2:
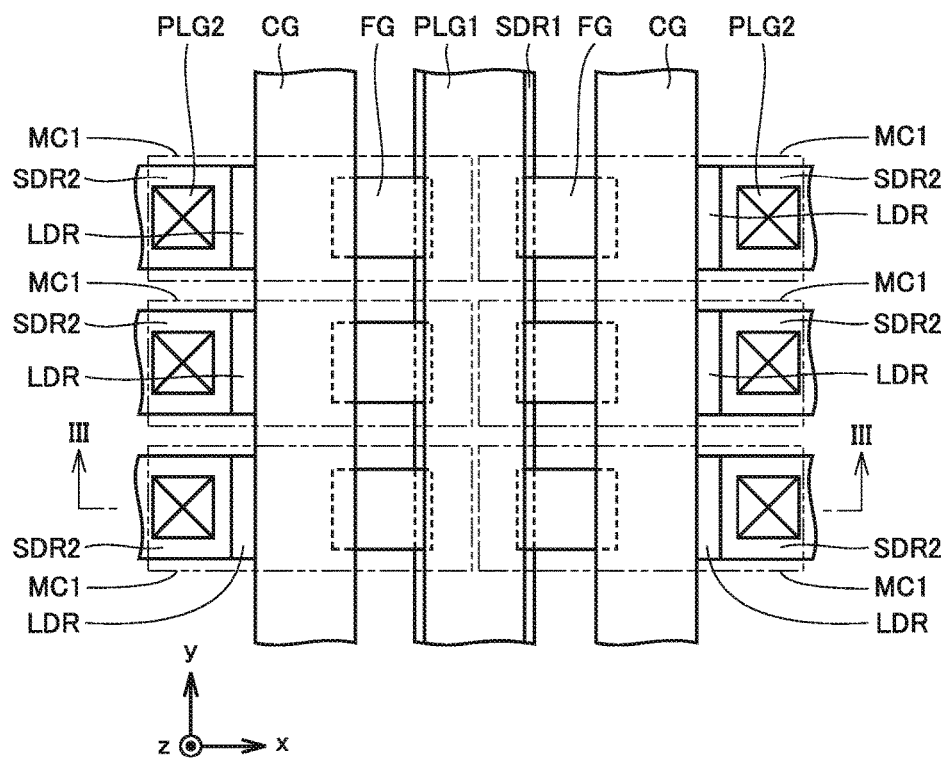
FIG. 2 is a plan view schematically showing a configuration of a non-volatile memory area of the semiconductor device in FIG. 1.

Referring to FIGS. 1 and 2, non-volatile memory area NVM of semiconductor device MCP includes a plurality of memory cells MC1. Non-volatile memory area NVM of semiconductor device MCP may further include a second plug PLG2, a bit line BTL, and an interlayer insulating film ILI. A configuration of memory cell MC1 included in non-volatile memory area NVM of semiconductor device MCP in the present embodiment will be described with reference to FIGS. 2 to 4.

Semiconductor substrate SUB has a principal surface PSF. Principal surface PSF of semiconductor substrate SUB extends in a first direction (for example, an x direction) and a second direction (for example, a y direction) intersecting with the first direction (for example, the x direction). A third direction (for example, a z direction) is a direction intersecting with principal surface PSF of semiconductor substrate SUB. A plurality of memory cells MC1 are arranged on principal surface PSF of semiconductor substrate SUB along the first direction (for example, the x direction) and the second direction (for example, the y direction). In the present embodiment, each of the plurality of memory cells MC1 has a floating gate structure of a split gate type. Each of the plurality of memory cells MC1 mainly includes semiconductor substrate SUB, a first source/drain region SDR1, a second source/drain region SDR2, a control gate CG, a floating gate FG, a gate insulating film GTI, and a tunnel insulating film TNI.

Semiconductor substrate SUB may be formed from a silicon substrate. A well WEL is provided in principal surface PSF of semiconductor substrate SUB and in the inside of semiconductor substrate SUB. Well WEL may contain a first impurity having a first conductivity type. The first conductivity type may be a p-type and well WEL may be a p-well.

First source/drain region SDR1 and second source/drain region SDR2 are provided in principal surface PSF of semiconductor substrate SUB provided with well WEL. Referring to FIG. 2, first source/drain region SDR1 is provided continuously over a plurality of memory cells MC1 along the second direction (for example, the y direction). First source/drain region SDR1 is provided in common to two memory cells MC1 in the first direction (for example, the x direction). Second source/drain region SDR2 is provided for each memory cell MC1 in the first direction (for example, the x direction) and the second direction (for example, the y direction). First source/drain region SDR1 and second source/drain region SDR2 may contain a second impurity having a second conductivity type. The second conductivity type is different in conductivity type from the first impurity contained in well WEL and may be an n+ type.

An impurity-containing region ICR may be provided in principal surface PSF of semiconductor substrate SUB provided with well WEL. Impurity-containing region ICR may be provided on opposing sides of first source/drain region SDR1 in the first direction (for example, the x direction). Impurity-containing region ICR may be in contact with first source/drain region SDR1 in the first direction (for example, the x direction). Impurity-containing region ICR is not in contact with second source/drain region SDR2 and an LDD region LDR. Impurity-containing region ICR may be a region containing an impurity of the first conductivity type such as the p-type. Impurity-containing region ICR may be used for controlling a threshold voltage of a transistor forming each memory cell MC1.

LDD region LDR may be provided in principal surface PSF of semiconductor substrate SUB provided with well WEL. LDD region LDR may function as a lightly doped drain (LDD) region. LDD region LDR may be in contact with second source/drain region SDR2 in the first direction (for example, the x direction). LDD region LDR is not in contact with first source/drain region SDR1 and impurity-containing region ICR. Referring to FIG. 2, LDD region LDR is provided for each memory cell MC1 in the first direction (for example, the x direction) and the second direction (for example, the y direction). LDD region LDR may contain a second impurity having the second conductivity type. The second conductivity type is different in conductivity type from the first impurity contained in well WEL and may be an n− type. LDD region LDR contains a second impurity having the second conductivity type at a concentration lower than in first source/drain region SDR1 and second source/drain region SDR2.

Gate insulating film GTI is provided on principal surface PSF of semiconductor substrate SUB. Gate insulating film GTI electrically isolates first source/drain region SDR1 and floating gate FG from each other. Gate insulating film GTI is in contact with first source/drain region SDR1. Gate insulating film GTI may be in contact with impurity-containing region ICR. Gate insulating film GTI may extend from a peripheral portion of first source/drain region SDR1 to a region between first source/drain region SDR1 and second source/drain region SDR in the first direction (for example, the x direction). Though gate insulating film GTI is not in contact with second source/drain region SDR and LDD region LDR in the present embodiment, gate insulating film GTI may be in contact with second source/drain region SDR2 and LDD region LDR. Gate insulating film GTI may be formed from a silicon oxide film.

A first plug PLG1 is formed on first source/drain region SDR1. First plug PLG1 is in contact with first source/drain region SDR1 and electrically connected to first source/drain region SDR1. Referring to FIG. 2, first plug PLG1 is provided continuously over a plurality of memory cells MC1 along the second direction (for example, the y direction). First plug PLG1 is provided in common to two memory cells MC1 in the first direction (for example, the x direction). First plug PLG1 may mainly contain polysilicon.

A first sidewall insulating film SWI1 is provided on a side surface of first plug PLG1. First sidewall insulating film SWI1 electrically isolates first plug PLG1 and floating gate FG from each other. First sidewall insulating film SWI1 may be provided also on gate insulating film GTI. First sidewall insulating film SWI1 may be formed from a silicon oxide film.

Floating gate FG is provided on gate insulating film GTI. Floating gate FG is provided on semiconductor substrate SUB with gate insulating film GTI being interposed. Referring to FIG. 2, floating gate FG is provided for each memory cell MC1 along the first direction (for example, the x direction) and the second direction (for example, the y direction). Floating gate FG is capacitively coupled to first source/drain region SDR1 with gate insulating film GTI being interposed. Floating gate FG is surrounded by gate insulating film GTI, a spacer insulating film SPI, and a tunnel insulating film TNI. Therefore, floating gate FG is electrically isolated from first source/drain region SDR1, first plug PLG1, and control gate CG by gate insulating film GTI, spacer insulating film SPI, and tunnel insulating film TNI. A threshold voltage of memory cell MC varies depending on an amount of charges held in floating gate FG. Floating gate FG may be formed from a polysilicon film.

Floating gate FG has a lower surface in contact with gate insulating film GTI, a first FG side surface FGSF1 located on a side of first source/drain region SDR1, a second FG side surface FGSF2 located on a side of second source/drain region SDR2, and an upper surface in contact with spacer insulating film SPI and tunnel insulating film TNI. A slanted portion SLT may be provided in the upper surface of floating gate FG such that floating gate FG increases in thickness from the side of first source/drain region SDR1 toward the side of second source/drain region SDR2.

Floating gate FG has a first tip portion TP1 opposed to control gate CG with tunnel insulating film TNI being interposed. First tip portion TP1 has a width w along the first direction (for example, the x direction). First tip portion TP1 is opposed to control gate CG over width w of first tip portion TP1. First tip portion TP1 may be included in slanted portion SLT. First tip portion TP1 may be provided in a portion of floating gate FG most distant from first source/drain region SDR1. First tip portion TP1 generally has a shape pointed at an angle of 90° or an angle smaller than 90°. Therefore, erasing electric field applied across floating gate FG and control gate CG in an erasing operation of memory cell MC1 is concentrated to first tip portion TP1. Consequently, electrons held in floating gate FG can efficiently be extracted to control gate CG. First tip portion TP1 may have a projecting first corner portion CNP1. The corner portion being projecting means that the corner portion has an angle greater than 0° and smaller than 180°. First corner portion CNP1 may have an angle preferably smaller than 90°. First tip portion TP1 opposed to control gate CG may have projecting first corner portion CNP1.

Spacer insulating film SPI is provided on floating gate FG except for first tip portion TP1. First tip portion TP1 of floating gate FG is exposed from spacer insulating film SPI. Spacer insulating film SPI may be in contact with first sidewall insulating film SWI1. Spacer insulating film SPI may be formed from a silicon oxide film. Spacer insulating film SPI may be formed from a high-temperature oxide (HTO) film.

Tunnel insulating film TNI is provided on first tip portion TP1 of floating gate FG. Tunnel insulating film TNI may be provided also on second FG side surface FGSF2 of floating gate FG. Tunnel insulating film TNI may further be provided also on semiconductor substrate SUB between gate insulating film GTI and second source/drain region SDR2. Tunnel insulating film TNI may be provided between control gate CG and semiconductor substrate SUB. Tunnel insulating film TNI provided between control gate CG and semiconductor substrate SUB electrically isolates control gate CG and semiconductor substrate SUB from each other. Tunnel insulating film TNI may further be provided between spacer insulating film SPI and control gate CG. In the erasing operation of memory cell MC1, electrons held in floating gate FG tunnel through tunnel insulating film TNI and are extracted to control gate CG. Tunnel insulating film TNI may be formed from a silicon oxide film.

Figure 4:
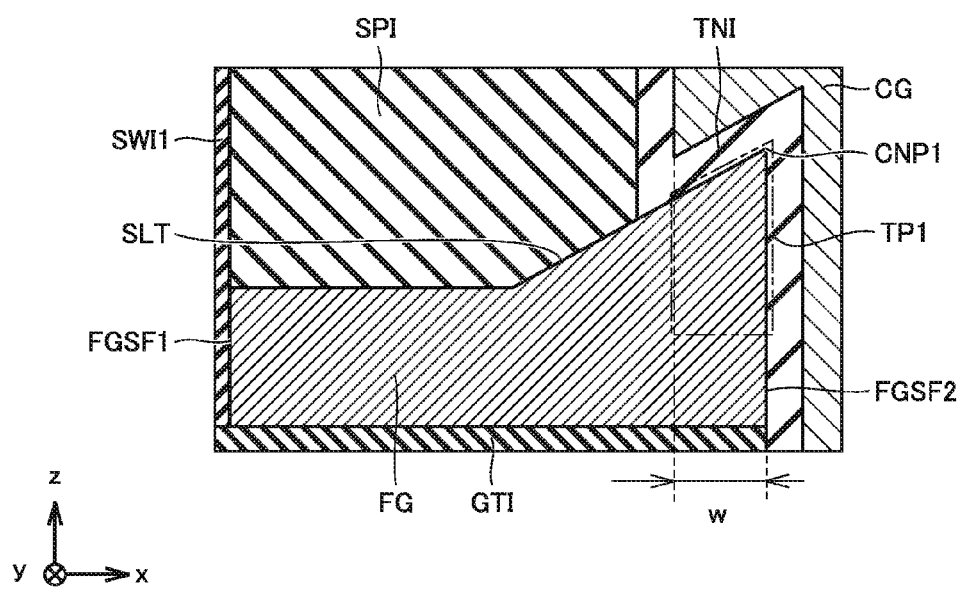
FIG. 4 is a partially enlarged schematic cross-sectional view of a portion IV in FIG. 3, of the semiconductor device according to the first embodiment.

Control gate CG is provided on tunnel insulating film TNI. Referring to FIG. 4, control gate CG is opposed to first tip portion TP1 of floating gate FG with tunnel insulating film TNI being interposed. Control gate CG may further be provided on semiconductor substrate SUB. Control gate CG may be provided on semiconductor substrate SUB between first source/drain region SDR1 and second source/drain region SDR2. More specifically, control gate CG may be provided on semiconductor substrate SUB between first source/drain region SDR1 and LDD region LDR. Control gate CG may be formed from a polysilicon film.

A first silicide layer SCL1 may be provided on second source/drain region SDR2. A second silicide layer SCL2 may be provided on first plug PLG1. A third silicide layer SCL3 may be provided on control gate CG. First silicide layer SCL1 is lower in electrical resistance than second source/drain region SDR2. Second silicide layer SCL2 is lower in electrical resistance than first plug PLG1. Third silicide layer SCL3 is lower in electrical resistance than control gate CG. First silicide layer SCL1, second silicide layer SCL2, and third silicide layer SCL3 may be formed from a $CoSi_x$ film.

A second sidewall insulating film SWI2 may be provided on a side surface of control gate CG opposite to first source/drain region SDR1. Second sidewall insulating film SWI2 is located between first silicide layer SCL1 and third silicide layer SCL3 and electrically isolates first silicide layer SCL1 and third silicide layer SCL3 from each other. In order to reliably prevent electrical short-circuiting between first silicide layer SCL1 and third silicide layer SCL3 by second sidewall insulating film SWI2, second sidewall insulating film SWI2 preferably has a height, for example, not smaller than 1500 Å (a length in the third direction (for example, the z direction)). Second sidewall insulating film SWI2 may be formed from a silicon oxide film. A protection film PTC may be provided over memory cell MC1 for protection of memory cell MC1. Protection film PTC may be made from an insulating material.

Second plug PLG2 extends in the third direction (for example, the z direction) intersecting with principal surface PSF of semiconductor substrate SUB. Second plug PLG2 is electrically connected to second source/drain region SDR2 of memory cell MC1. First silicide layer SCL1 may be provided between second plug PLG2 and second source/drain region SDR2. Second plug PLG2 is electrically connected to bit line BTL. Bit line BTL is located over a plurality of memory cells MC1. Bit line BTL may extend in parallel to principal surface PSF of semiconductor substrate SUB. Interlayer insulating film ILI may be provided between bit line BTL and protection film PTC.

Figure 5A:
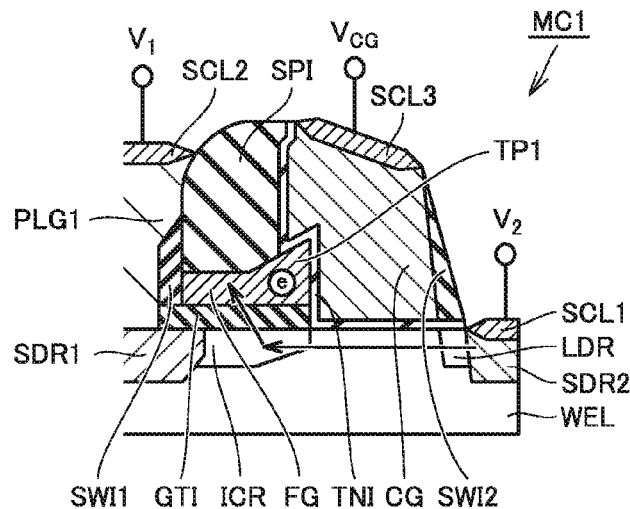
FIG. 5A is a diagram showing a writing operation of a non-volatile memory cell in the semiconductor device according to the first embodiment.

An operation of memory cell MC1 included in semiconductor device MCP in the present embodiment, which includes a floating gate structure of a split gate type, will be described. An operation of memory cell MC1 at the time when data is written in memory cell MC1 including the floating gate structure of the split gate type will be described with reference to FIG. 5A. A voltage $V_1$ of first source/drain region SDR1 is set to be higher than a voltage $V_2$ of second source/drain region SDR2 and a voltage $V_{CG}$ of control gate CG. First source/drain region SDR1 functions as a drain and second source/drain region SDR2 functions as a source. Electrons released from second source/drain region SDR2 are accelerated by intense electric field in a channel region between first source/drain region SDR1 and second source/drain region SDR2 and become hot electrons which are electrons in a high energy state. These hot electrons are injected into floating gate FG through gate insulating film GTI. Data is thus written into memory cell MC1. A state that electrons are held in floating gate FG is referred to as a written state of memory cell MC1. As electrons are held in floating gate FG, a threshold voltage of memory cell MC1 increases.

Figure 5B:
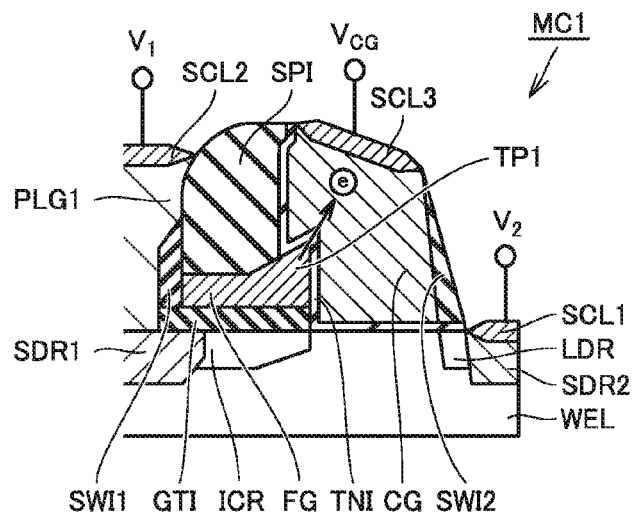
FIG. 5B is a diagram showing an erasing operation of a non-volatile memory cell in the semiconductor device according to the first embodiment.

An operation of memory cell MC1 in erasing data from memory cell MC1 including the floating gate structure of the split gate type will be described with reference to FIG. 5B. Voltage $V_{CG}$ of control gate CG is set to be higher than voltage $V_1$ of first source/drain region SDR1 and voltage $V_2$ of second source/drain region SDR2. High electric field is applied to tunnel insulating film TNI between floating gate FG and control gate CG and a Fowler-Nordheim (FN) tunnel current flows. First tip portion TP1 has a shape substantially pointed at an angle of 90° or an angle smaller than 90°. Erasing electric field applied across floating gate FG and control gate CG in the erasing operation of memory cell MC1 is concentrated to first tip portion TP1. In particular, intense electric field is generated around projecting first corner portion CNP1 of first tip portion TP1. Therefore, first tip portion TP1 of floating gate FG improves efficiency in extracting electrons from floating gate FG. In the erasing operation of memory cell MC1, electrons held in floating gate FG move from first tip portion TP1 to tunnel insulating film TNI, tunnel through tunnel insulating film TNI, and are extracted to control gate CG. Data held in memory cell MC1 is thus erased. A state that electrons are not held in floating gate FG is referred to as an erase state of memory cell MC1. As electrons are extracted from floating gate FG, a threshold voltage of memory cell MC1 lowers. Width w of first tip portion TP1 opposed to control gate CG affects characteristics of memory cell MC1 such as an erasing voltage and an erasing speed of memory cell MC1. Therefore, it is important to provide memory cell MC1 in which variation in width w of first tip portion TP1 opposed to control gate CG is suppressed and a method of manufacturing such a memory cell MC1.

An operation of memory cell MC1 in reading data from memory cell MC1 including the floating gate structure of the split gate type will be described. Voltage $V_2$ of second source/drain region SDR2 is set to be higher than voltage $V_1$ of first source/drain region SDR1. First source/drain region SDR1 functions as the source and second source/drain region SDR2 functions as the drain. Voltage $V_{CG}$ higher than voltage $V_2$ of second source/drain region SDR2 is applied to control gate CG, so as to activate a transistor constituted of control gate CG, first source/drain region SDR1, and second source/drain region SDR2. Since a threshold voltage of memory cell MC1 is low while memory cell MC1 is in the erase state, a read current flows. In contrast, since a threshold voltage of memory cell MC1 is high while memory cell MC1 is in a written state, substantially no read current flows. Whether or not memory cell MC1 is in the written state can be read by detecting magnitude of a read current.

A method of manufacturing memory cell MC1 included in non-volatile memory area NVM of semiconductor device MCP in the present embodiment will be described with reference to FIGS. 6 to 28.

Figure 6:
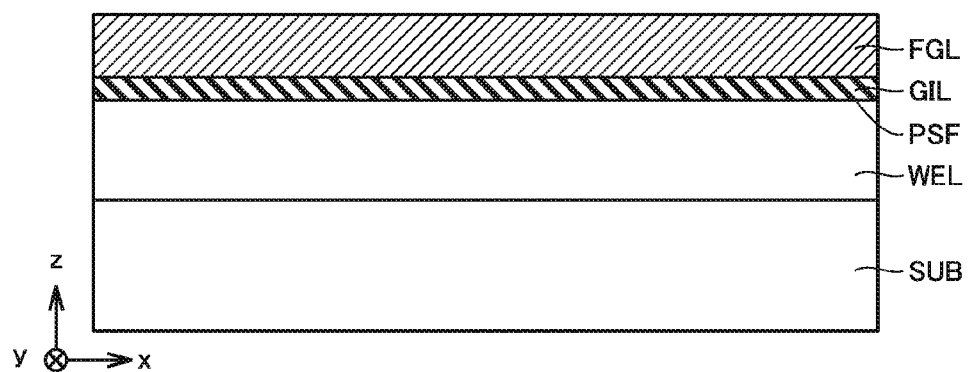
FIG. 6 is a schematic cross-sectional view showing one step in a method of manufacturing a semiconductor device according to first and second embodiments.

Referring to FIG. 6, an insulating layer for the gate insulating film GIL and a conductive layer for the floating gate FGL are formed on principal surface PSF of semiconductor substrate SUB. Specifically, insulating layer for the gate insulating film GIL is formed on principal surface PSF of semiconductor substrate SUB. Insulating layer for the gate insulating film GIL is a layer which will be gate insulating film GTI later. Insulating layer for the gate insulating film GIL may be formed from a silicon oxide layer. In succession, conductive layer for the floating gate FGL is formed on insulating layer for the gate insulating film GIL. Conductive layer for the floating gate FGL is a layer which will be floating gate FG later. Conductive layer for the floating gate FGL may be formed from a polysilicon layer. Then, well WEL is formed in principal surface PSF of semiconductor substrate SUB and in the inside of semiconductor substrate SUB by implanting an impurity having the first conductivity type from a side of principal surface PSF of semiconductor substrate SUB. An impurity having the first conductivity type may be a p-type impurity such as boron. Well WEL may be a P-well.

Figure 7:
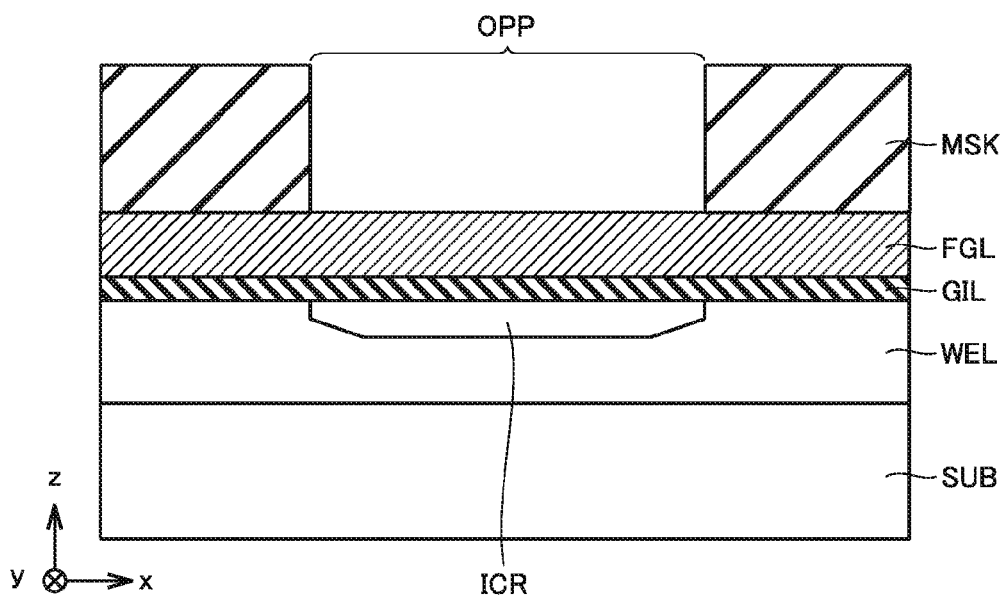
FIG. 7 is a schematic cross-sectional view showing a step following the step shown in FIG. 6, in the method of manufacturing a semiconductor device according to the first and second embodiments.

Referring to FIG. 7, a mask layer MSK having an opening portion OPP is formed on conductive layer for the floating gate FGL. Mask layer MSK may be one of a silicon nitride (SiN) film, a silicon oxynitride (SiON) film, and a silicon carbonitride (SiCN) film. Mask layer MSK may have a thickness, for example, from 3500 to 4000 Å. Mask layer MSK having opening portion OPP may be formed with a photolithography technique. An impurity having the first conductivity type such as boron is implanted into principal surface PSF of semiconductor substrate SUB by using mask layer MSK having opening portion OPP. Though a method of implanting the impurity having the first conductivity type into principal surface PSF of semiconductor substrate SUB is not particularly limited, it may be ion implantation. Impurity-containing region ICR is thus formed in principal surface PSF of semiconductor substrate SUB.

Figure 8:
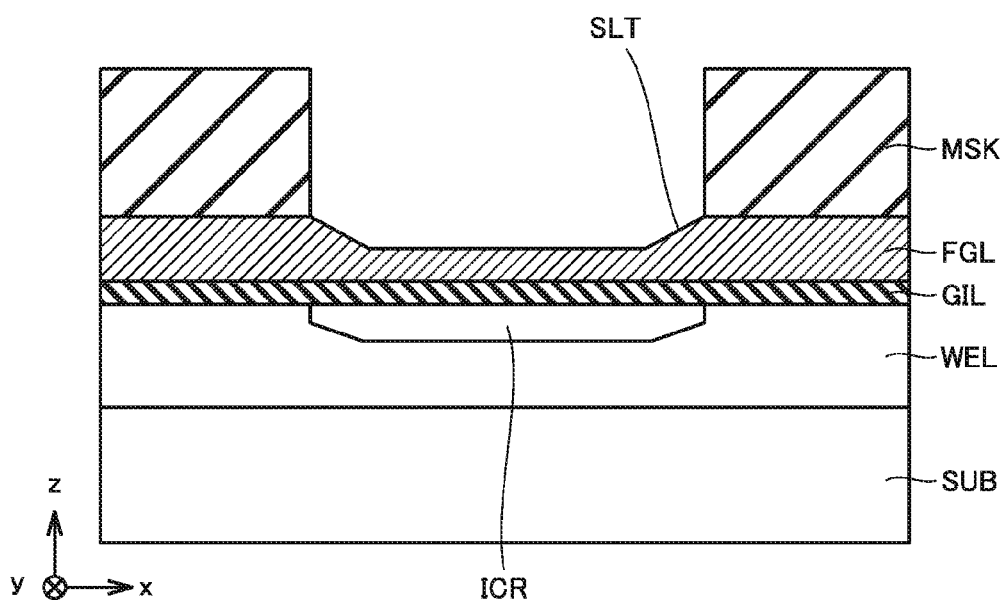
FIG. 8 is a schematic cross-sectional view showing a step following the step shown in FIG. 7, in the method of manufacturing a semiconductor device according to the first and second embodiments.

Referring to FIG. 8, slanted portion SLT is formed in an upper surface of conductive layer for the floating gate FGL by removing a part of conductive layer for the floating gate FGL by using mask layer MSK having opening portion OPP. Specifically, conductive layer for the floating gate FGL exposed from opening portion OPP of mask layer MSK is underetched. With underetching, slanted portion SLT in which a thickness of conductive layer for the floating gate FGL decreases with a greater distance from mask layer MSK is formed in the upper surface of conductive layer for the floating gate FGL close to mask layer MSK. A part of slanted portion SLT becomes first tip portion TP1 of floating gate FG in a subsequent step.

Referring to FIGS. 9 to 14, spacer insulating film SPI, a second insulating film ILF2 which is in contact with a side surface of spacer insulating film SPI and is composed of a different material from spacer insulating film SPI and insulating layer for the gate insulating film GIL, and a first insulating film ILF1 which is in contact with a side surface of second insulating film ILF2 opposite to spacer insulating film SPI and is composed of a the same material as insulating layer for the gate insulating film GIL are formed on conductive layer for the floating gate FGL.

Figure 9:
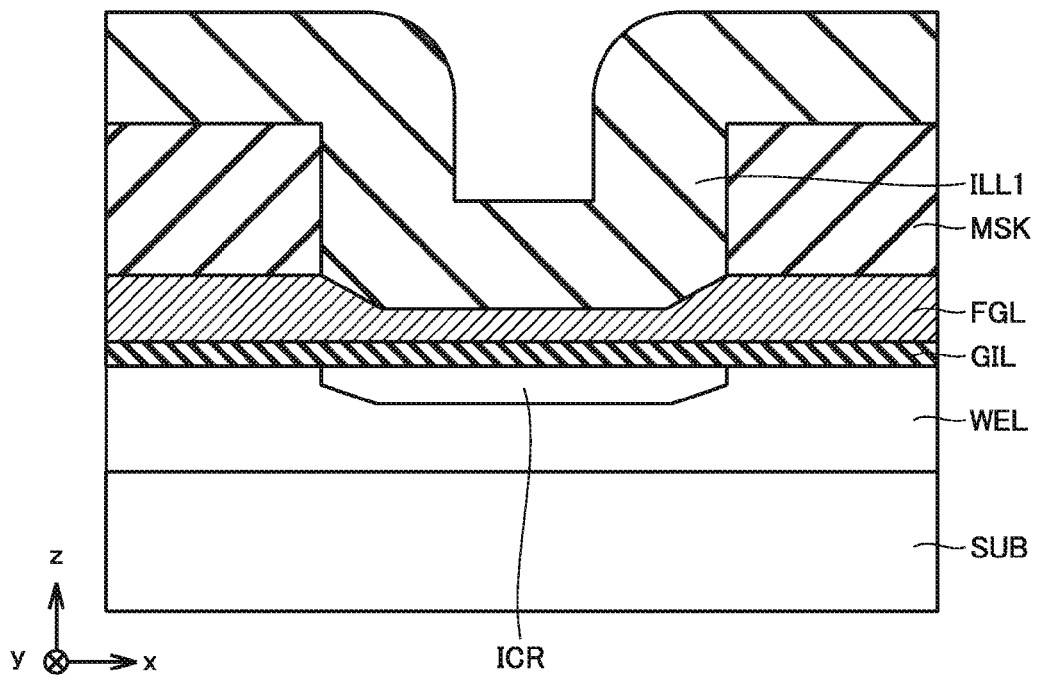
FIG. 9 is a schematic cross-sectional view showing a step following the step shown in FIG. 8, in the method of manufacturing a semiconductor device according to the first and second embodiments.
Figure 10:
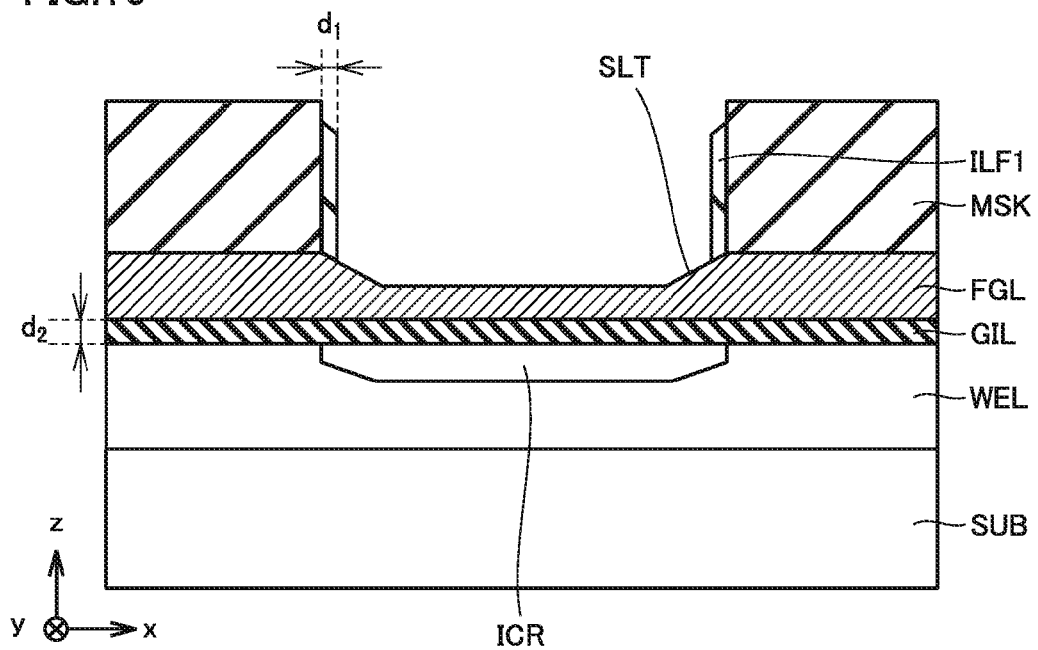
FIG. 10 is a schematic cross-sectional view showing a step following the step shown in FIG. 9, in the method of manufacturing a semiconductor device according to the first embodiment.

Referring to FIGS. 9 and 10, first insulating film ILF1 is formed on a side surface of mask layer MSK which faces opening portion OPP and on slanted portion SLT of conductive layer for the floating gate FGL. Specifically, referring to FIG. 9, a first insulating layer for the first insulating film ILL1 is formed in opening portion OPP of mask layer MSK and on mask layer MSK. Referring to FIG. 10, first insulating film ILF1 is formed on the side surface of mask layer MSK which faces opening portion OPP and on slanted portion SLT of conductive layer for the floating gate FGL by etching back first insulating layer for the first insulating film ILL1. First insulating layer for the first insulating film ILL1 and first insulating film ILF1 may be composed of the same material as insulating layer for the gate insulating film GIL, such as a silicon oxide film. First insulating layer for the first insulating film ILL1 and first insulating film ILF1 may be formed from a non-doped silicate glass (NSG) layer representing one of silicon oxide films. The NSG layer may be formed with chemical vapor deposition (CVD), by using a gas containing tetraethoxysilane (TEOS). A thickness $d_1$ of first insulating film ILF1 may be smaller than a thickness $d_2$ of insulating layer for the gate insulating film GIL. Thickness $d_1$ of first insulating film ILF1 is defined as a length of first insulating film ILF1 in the first direction (for example, the x direction). Thickness $d_2$ of insulating layer for the gate insulating film GIL is defined as a length of insulating layer for the gate insulating film GIL in the third direction (for example, the z direction).

Figure 11:
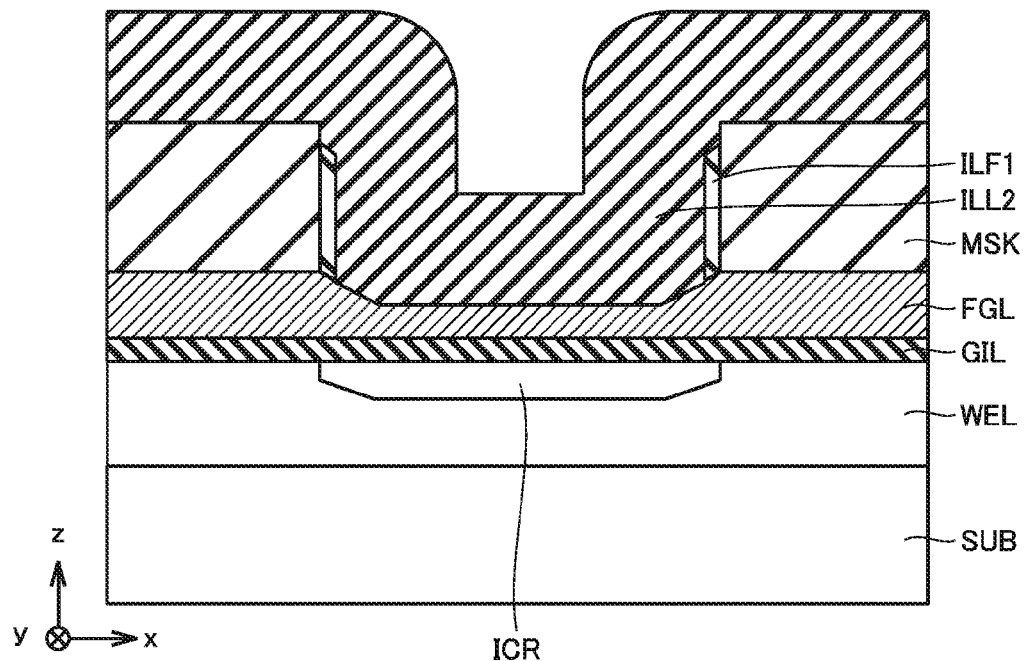
FIG. 11 is a schematic cross-sectional view showing a step following the step shown in FIG. 10, in the method of manufacturing a semiconductor device according to the first embodiment.
Figure 12:
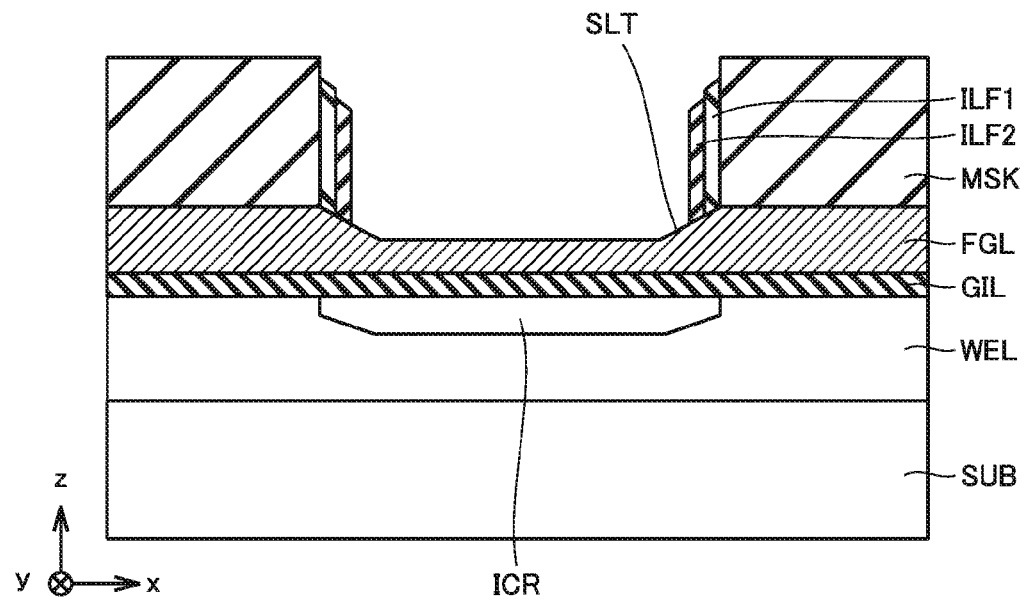
FIG. 12 is a schematic cross-sectional view showing a step following the step shown in FIG. 11, in the method of manufacturing a semiconductor device according to the first embodiment.

Referring to FIGS. 11 and 12, second insulating film ILF2 is formed on a side surface of first insulating film ILF1 and slanted portion SLT of conductive layer for the floating gate FGL. Specifically, referring to FIG. 11, a second insulating layer for the second insulating film ILL2 is formed in opening portion OPP of mask layer MSK, on mask layer MSK, and on first insulating film ILF1. Referring to FIG. 12, second insulating layer for the second insulating film ILL2 is etched back so that second insulating film ILF2 is formed on the side surface of first insulating film ILF1 and on slanted portion SLT of conductive layer for the floating gate FGL. Second insulating layer for the second insulating film ILL2 and second insulating film ILF2 are composed of a different material from spacer insulating film SPI and insulating layer for the gate insulating film GIL such as a silicon nitride (SiN) film, a silicon oxynitride (SiON) film, or a silicon carbonitride (SiCN) film. Second insulating layer for the second insulating film ILL2 and second insulating film ILF2 may be composed of the same material as mask layer MSK.

Figure 13:
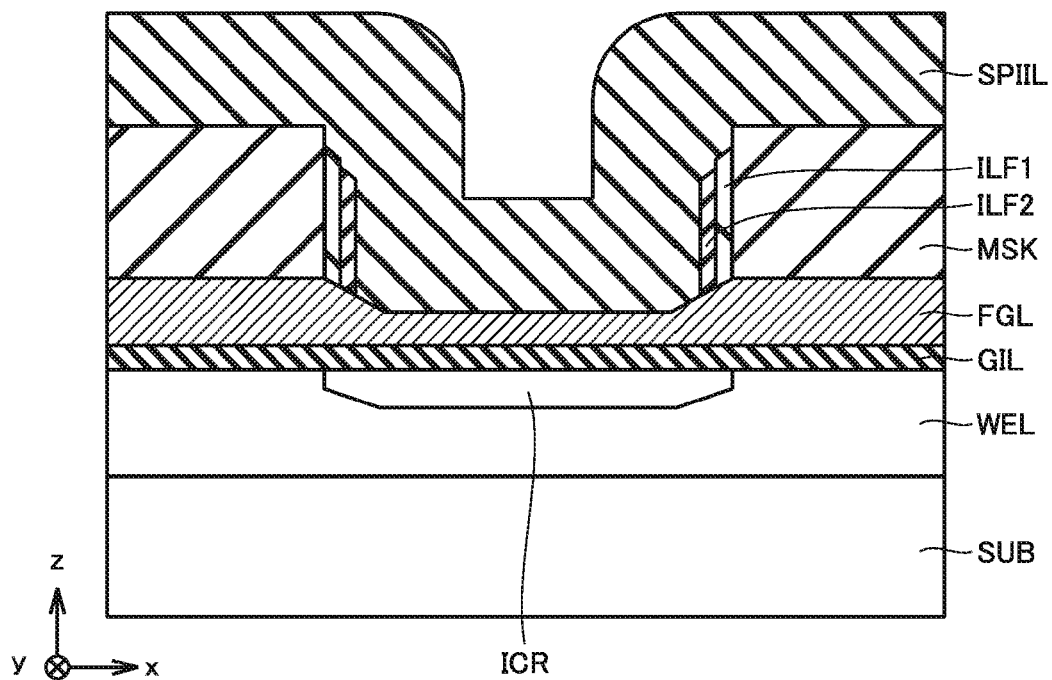
FIG. 13 is a schematic cross-sectional view showing a step following the step shown in FIG. 12, in the method of manufacturing a semiconductor device according to the first embodiment.
Figure 14:
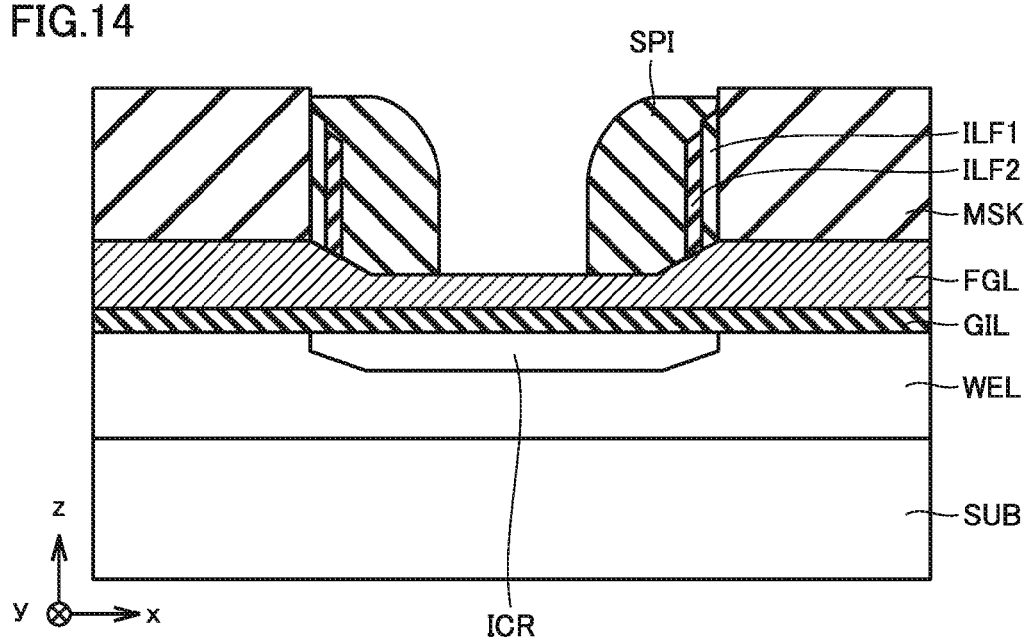
FIG. 14 is a schematic cross-sectional view showing a step following the step shown in FIG. 13, in the method of manufacturing a semiconductor device according to the first embodiment.

Referring to FIGS. 13 and 14, spacer insulating film SPI is formed on a side surface of second insulating film ILF2 and an upper surface of conductive layer for the floating gate FGL. Specifically, referring to FIG. 13, an insulating layer for the spacer insulating film SPIIL is formed in opening portion OPP of mask layer MSK, on mask layer MSK, on first insulating film ILF1, and second insulating film ILF2. Insulating layer for the spacer insulating film SPIIL may be composed of the same material as insulating layer for the gate insulating film GIL and first insulating film ILF1 such as a silicon oxide film. Insulating layer for the spacer insulating film SPIIL may be formed from a high-temperature oxide (HTO) layer formed with chemical vapor deposition (CVD) at a temperature, for example, of 800° C. and composed of silicon oxide. Referring to FIG. 14, insulating layer for the spacer insulating film SPIIL is etched back so that spacer insulating film SPI is formed on a side surface of second insulating film ILF2 and slanted portion SLT of conductive layer for the floating gate FGL. Spacer insulating film SPI may further be formed on first insulating film ILF1 and on the side surface of mask layer MSK facing opening portion OPP. Spacer insulating film SPI may be composed of the same material as insulating layer for the gate insulating film GIL and first insulating film ILF1 such as a silicon oxide film.

Figure 15:
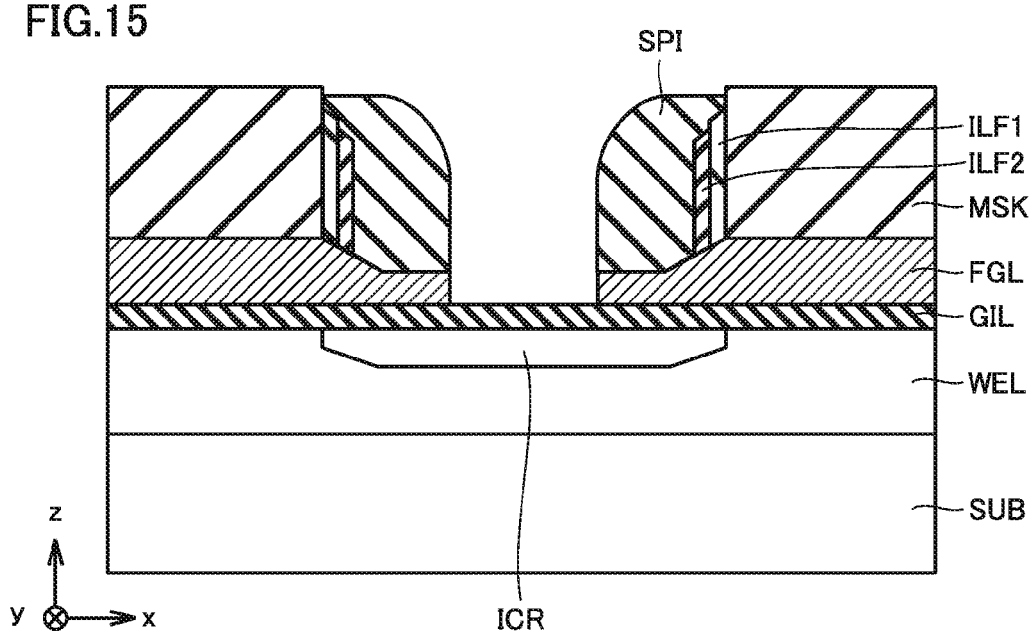
FIG. 15 is a schematic cross-sectional view showing a step following the step shown in FIG. 14, in the method of manufacturing a semiconductor device according to the first embodiment.

Referring to FIG. 15, a part of conductive layer for the floating gate FGL is removed by using mask layer MSK, first insulating film ILF1, second insulating film ILF2, and spacer insulating film SPI as a mask. A side surface which will be first FG side surface FGSF1 (see FIG. 4) of floating gate FG in a subsequent step is formed in conductive layer for the floating gate FGL.

Figure 16:
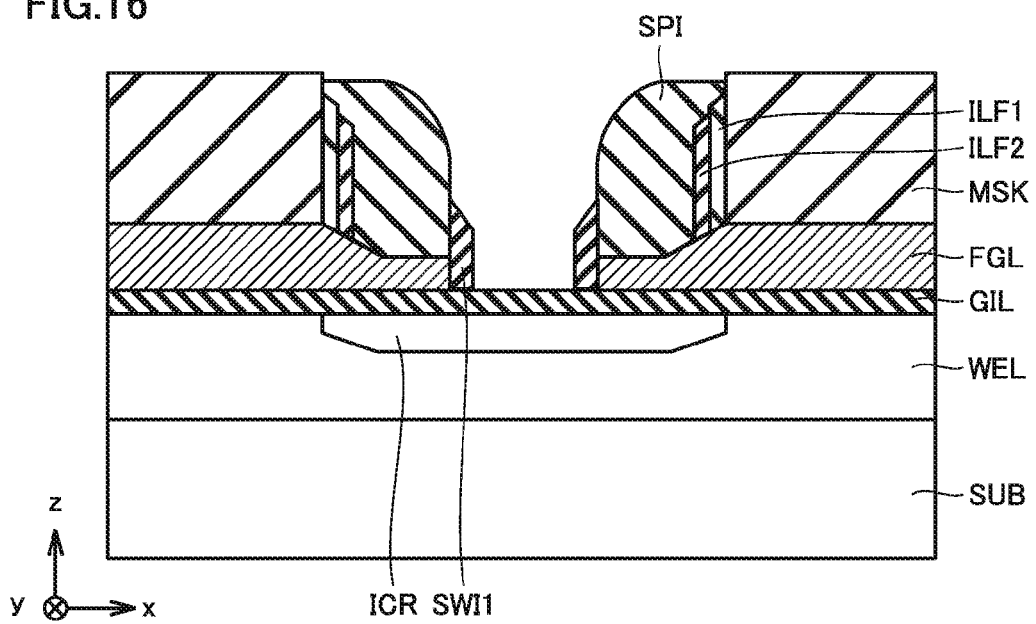
FIG. 16 is a schematic cross-sectional view showing a step following the step shown in FIG. 15, in the method of manufacturing a semiconductor device according to the first embodiment.

Referring to FIG. 16, first sidewall insulating film SWI1 is formed on a side surface of spacer insulating film SPI and first FG side surface FGSF1 of conductive layer for the floating gate FGL. An insulating layer for a first sidewall insulating film (not shown) is formed on mask layer MSK, spacer insulating film SPI, first FG side surface FGSF1 of conductive layer for the floating gate FGL, and insulating layer for the gate insulating film GIL. First sidewall insulating film SWI1 is formed on the side surface of spacer insulating film SPI and the side surface of conductive layer for the floating gate FGL by etching back the insulating layer for the first sidewall insulating film. The insulating layer for the first sidewall insulating film and first sidewall insulating film SWI1 may be composed of the same material as insulating layer for the gate insulating film GIL, first insulating film ILF1, and spacer insulating film SPI such as a silicon oxide film. The insulating layer for the first sidewall insulating film and first sidewall insulating film SWI1 may be formed from a high-temperature oxide (HTO) layer formed with chemical vapor deposition (CVD) at a temperature, for example, of 800° C. and composed of a silicon oxide.

Figure 17:
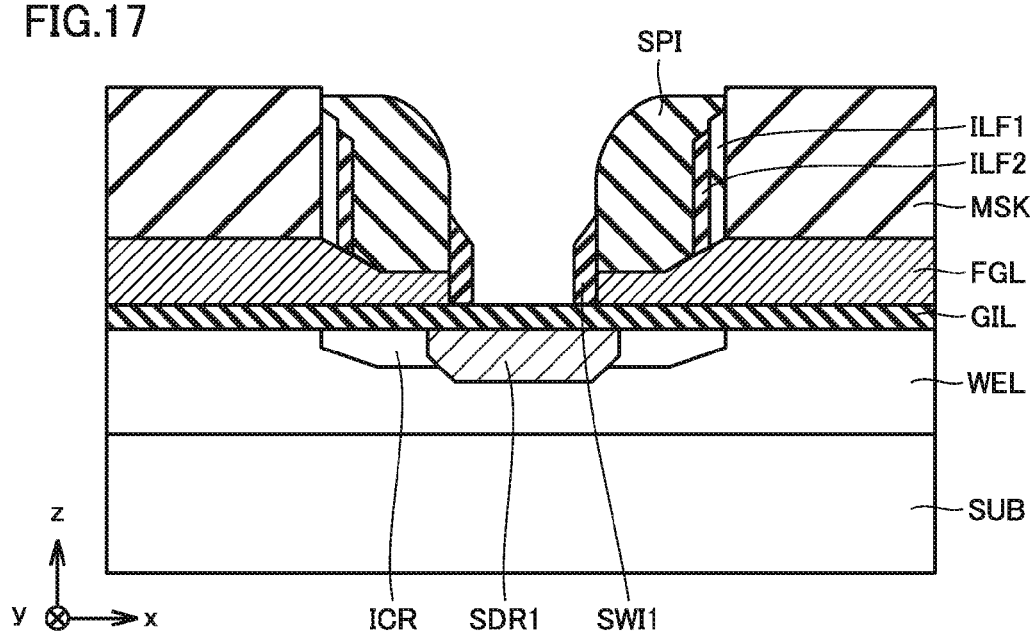
FIG. 17 is a schematic cross-sectional view showing a step following the step shown in FIG. 16, in the method of manufacturing a semiconductor device according to the first embodiment.

Referring to FIG. 17, an impurity having the second conductivity type such as arsenic is implanted into principal surface PSF of semiconductor substrate SUB by using mask layer MSK, spacer insulating film SPI, and first sidewall insulating film SWI1 as a mask. First source/drain region SDR1 is thus formed in principal surface PSF of semiconductor substrate SUB. The impurity having the second conductivity type may be implanted into principal surface PSF of semiconductor substrate SUB with such a method as ion implantation.

Figure 18:
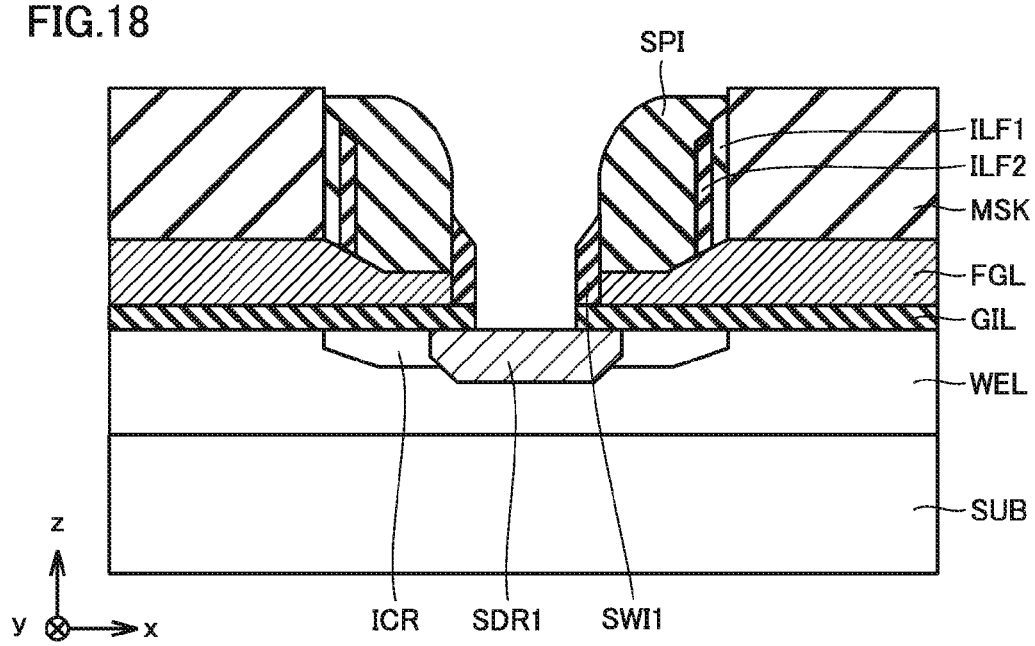
FIG. 18 is a schematic cross-sectional view showing a step following the step shown in FIG. 17, in the method of manufacturing a semiconductor device according to the first embodiment.

Referring to FIG. 18, insulating layer for the gate insulating film GIL is anisotropically dry-etched by using mask layer MSK, spacer insulating film SPI, and first sidewall insulating film SWI1 as a mask. With this anisotropic dry etching, a part of insulating layer for the gate insulating film GIL is selectively removed.

Figure 19:
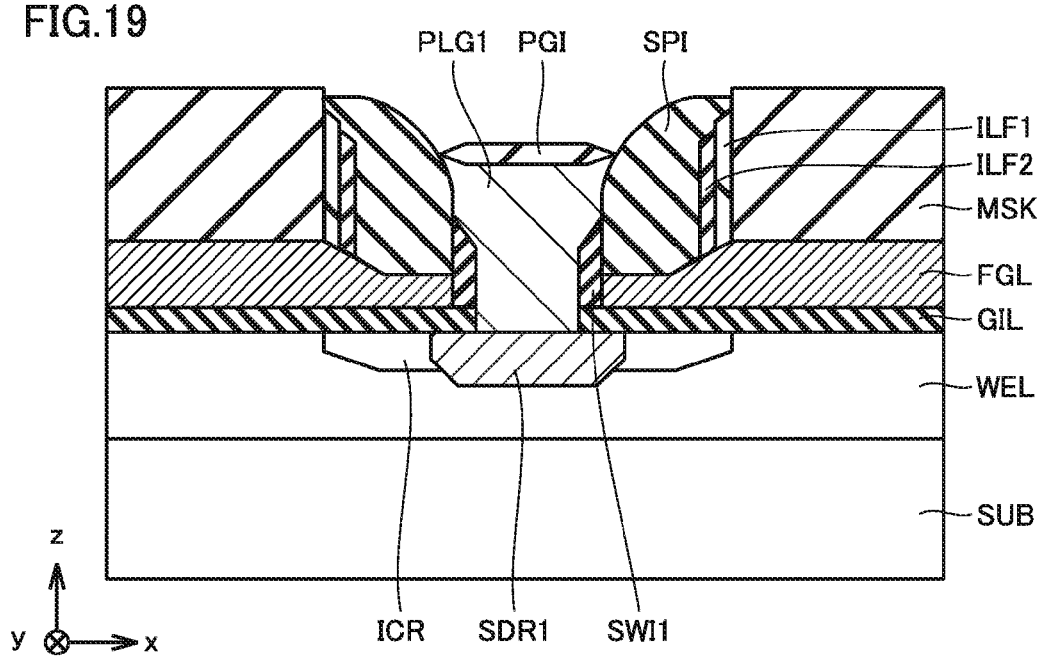
FIG. 19 is a schematic cross-sectional view showing a step following the step shown in FIG. 18, in the method of manufacturing a semiconductor device according to the first embodiment.

Referring to FIG. 19, first plug PLG1 is formed on first source/drain region SDR1, the side surface of spacer insulating film SPI, and first sidewall insulating film SWI1. First plug PLG1 is formed from a conductive film such as a polysilicon film. A conductive layer for the first plug (not shown) composed of polysilicon is formed on mask layer MSK, spacer insulating film SPI, first sidewall insulating film SWI1, and first source/drain region SDR1. The conductive layer for the first plug is subjected to chemical mechanical polishing (CP) and then the conductive layer for the first plug is etched back. First plug PLG1 is thus formed. In succession, for facilitating oxidation of an upper portion of first plug PLG1, an impurity having the second conductivity type such as arsenic is implanted into the upper portion of first plug PLG1. Then, first plug PLG1 is subjected to thermal oxidation treatment. A plug insulating film PGI is thus formed in the upper portion of first plug PLG1.

Figure 20:
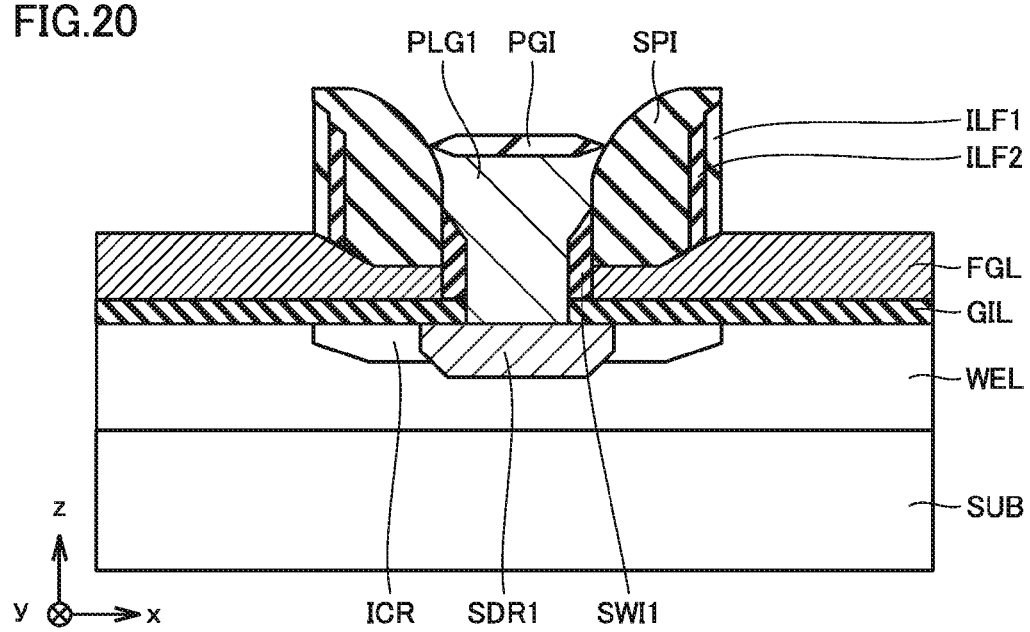
FIG. 20 is a schematic cross-sectional view showing a step following the step shown in FIG. 19, in the method of manufacturing a semiconductor device according to the first embodiment.

Referring to FIG. 20, mask layer MSK is selectively removed through wet etching using phosphoric acid. Since first insulating film ILF1 is different from mask layer MSK in material, an etching rate for first insulating film ILF1 can be lower than an etching rate of mask layer MSK. Therefore, mask layer MSK may selectively be removed with first insulating film ILF1 functioning as an etch stop film. When second insulating film ILF2 is composed of the same material as a material for mask layer MSK, first insulating film ILF1 protects second insulating film ILF2 against etching while mask layer MSK is selectively etched. When second insulating film ILF2 is composed of a material which is not removed together with mask layer MSK in selective removal of mask layer MSK, first insulating film ILF1 does not have to be provided.

Figure 21:
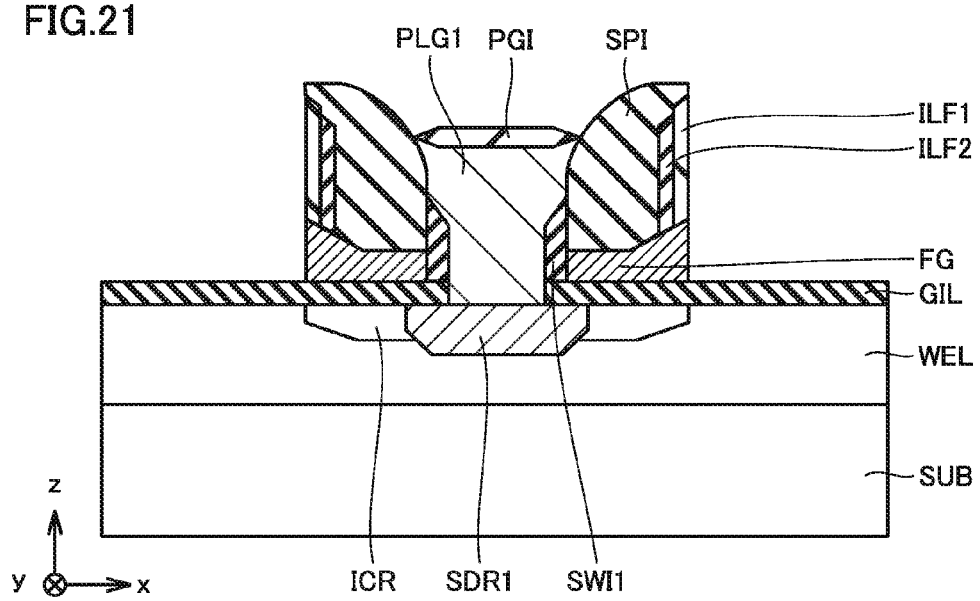
FIG. 21 is a schematic cross-sectional view showing a step following the step shown in FIG. 20, in the method of manufacturing a semiconductor device according to the first embodiment.

Referring to FIG. 21, a part of conductive layer for the floating gate FGL is removed by using spacer insulating film SPI, first insulating film ILF1, and second insulating film ILF2 as a mask. Thus, floating gate FG having first tip portion TP1 is formed from conductive layer for the floating gate FGL, and a part of insulating layer for the gate insulating film GIL is exposed from floating gate FG. Dry etching can be exemplified as a method of forming floating gate FG from conductive layer for the floating gate FGL. Second FG side surface FGSF2 (see FIG. 4) is formed on a side opposite to the first FG side surface of floating gate FG, by removing a part of conductive layer for the floating gate FGL.

Figure 22:
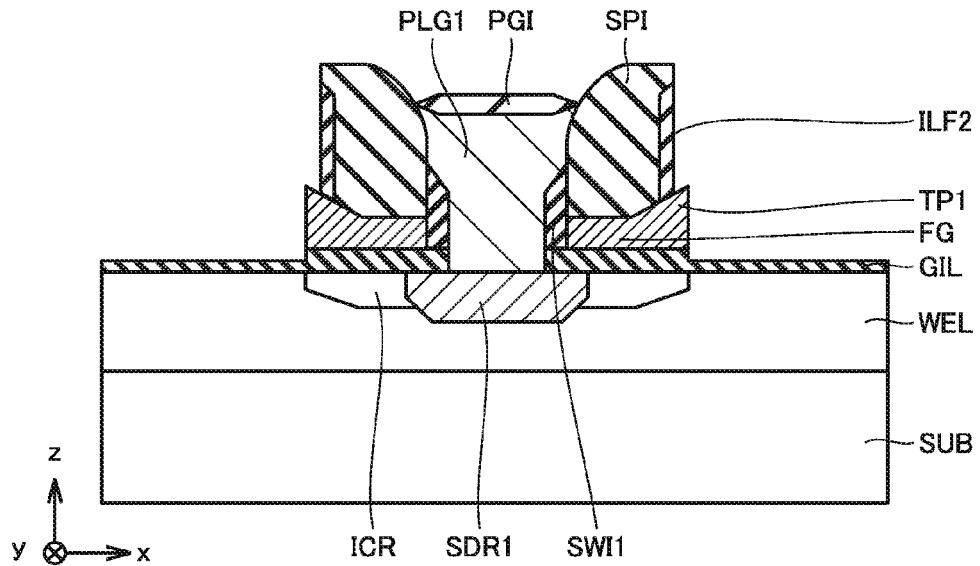
FIG. 22 is a schematic cross-sectional view showing a step following the step shown in FIG. 21, in the method of manufacturing a semiconductor device according to the first embodiment.

Referring to FIG. 22, a part of first tip portion TP1 of floating gate FG is exposed by removing first insulating film ILF1. A part of first tip portion TP1 of floating gate FG may be exposed, for example, by selectively removing first insulating film ILF1, of first insulating film ILF1 and second insulating film ILF2. Since second insulating film ILF2 is different from first insulating film ILF1 in material, an etching rate for second insulating film ILF2 can be lower than an etching rate for first insulating film ILF1. Therefore, first insulating film ILF1 may selectively be removed with second insulating film ILF2 functioning as an etch stop film. Wet etching can be exemplified as a method of removing first insulating film ILF1. When first insulating film ILF1 is removed, a part of insulating layer for the gate insulating film GIL may also be removed. Thickness $d_1$ of first insulating film ILF1 may be smaller than thickness $d_2$ of insulating layer for the gate insulating film GIL. Therefore, a part of insulating layer for the gate insulating film GIL not covered with floating gate FG remains on principal surface PSF of semiconductor substrate SUB when first insulating film ILF1 is completely removed. Consequently, removal of insulating layer for the gate insulating film GIL under floating gate FG in a lateral direction, that is, at least one of the first direction (for example, the x direction) and the second direction (for example, the y direction), can more reliably be prevented. Thickness $d_1$ of first insulating film ILF1 is defined as a length of first insulating film ILF1 in the first direction (for example, the x direction). Thickness $d_2$ of insulating layer for the gate insulating film GIL is defined as a length of insulating layer for the gate insulating film GIL in the third direction (for example, the z direction).

Figure 23:
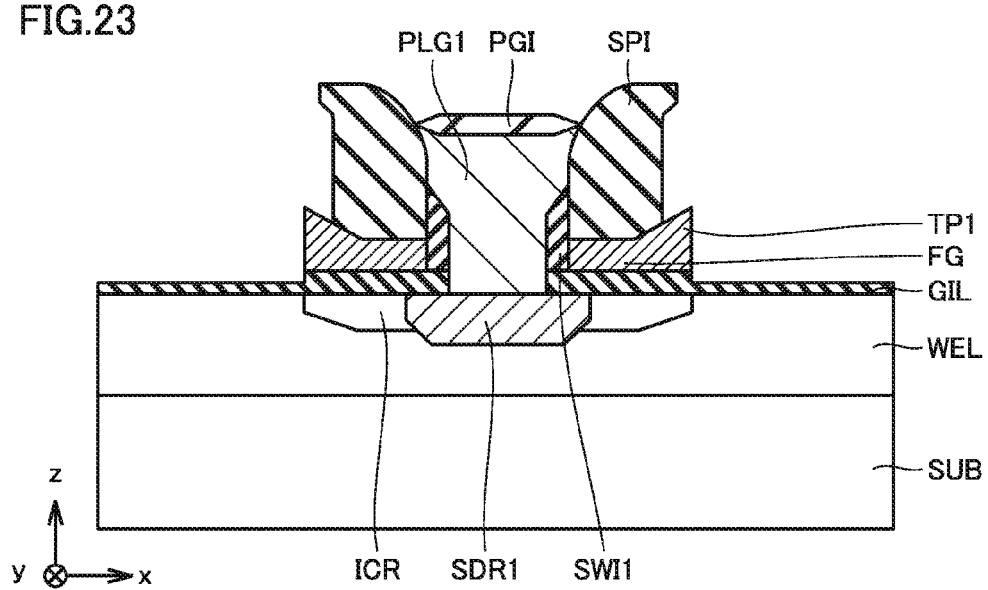
FIG. 23 is a schematic cross-sectional view showing a step following the step shown in FIG. 22, in the method of manufacturing a semiconductor device according to the first embodiment.

Referring to FIG. 23, first tip portion TP1 of floating gate FG is further exposed by selectively removing second insulating film ILF2 among second insulating film ILF2, insulating layer for the gate insulating film GIL, and spacer insulating film SPI. Since second insulating film ILF2 is different from spacer insulating film SPI in material, an etching rate for spacer insulating film SPI can be much lower than an etching rate for second insulating film ILF2. Therefore, second insulating film ILF2 can selectively be removed with spacer insulating film SPI functioning as an etch stop film. Variation in width of exposure of floating gate FG through spacer insulating film SPI can be suppressed by completely removing second insulating film ILF2. Since second insulating film ILF2 is different from insulating layer for the gate insulating film GIL in material, an etching rate for insulating layer for the gate insulating film GIL can be much lower than an etching rate for second insulating film ILF2. Substantially no insulating layer for the gate insulating film GIL is removed while second insulating film ILF2 is completely removed. Therefore, removal of insulating layer for the gate insulating film GIL under floating gate FG in the lateral direction can be prevented. Wet etching can be exemplified as a method of selectively removing second insulating film ILF2.

Figure 24:
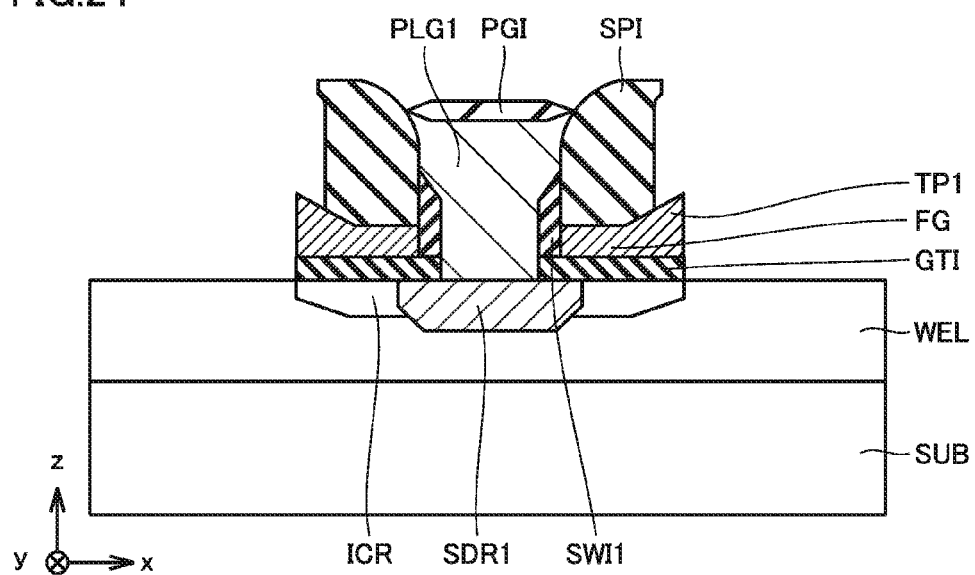
FIG. 24 is a schematic cross-sectional view showing a step following the step shown in FIG. 23, in the method of manufacturing a semiconductor device according to the first embodiment.
Figure 25:
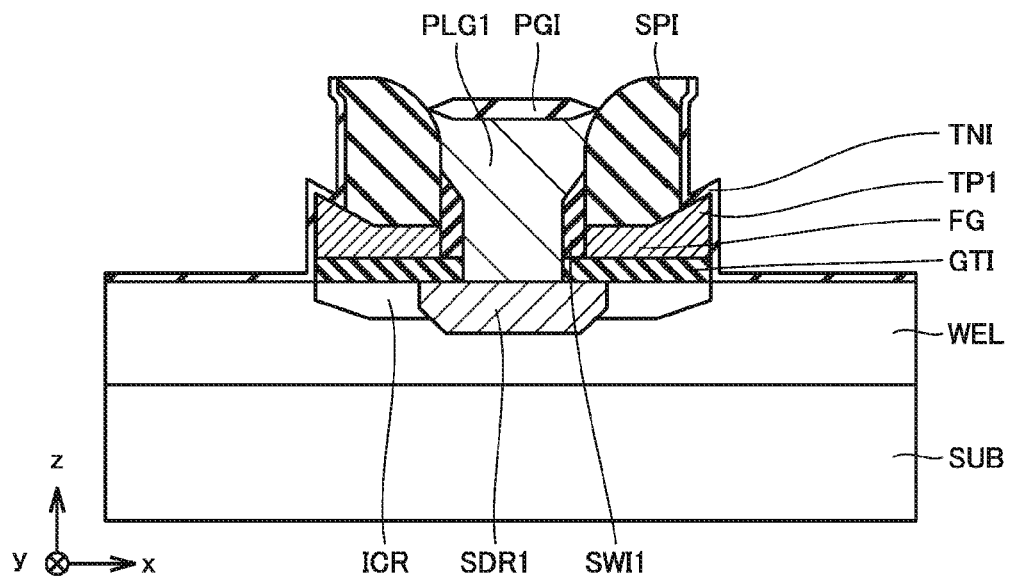
FIG. 25 is a schematic cross-sectional view showing a step following the step shown in FIG. 24, in the method of manufacturing a semiconductor device according to the first embodiment.

Referring to FIG. 24, gate insulating film GTI may be formed by removing a part of insulating layer for the gate insulating film GIL by using floating gate FG as a mask. Variation in width of exposure of floating gate FG through spacer insulating film SPI has already been suppressed in selective removal of second insulating film ILF2 shown in FIG. 23. Therefore, in removing a part of insulating layer for the gate insulating film GIL shown in FIG. 24, insulating layer for the gate insulating film GIL exposed from floating gate FG can be removed without taking into account a width of exposure of floating gate FG through spacer insulating film SPI. Therefore, removal of insulating layer for the gate insulating film GIL under floating gate FG in the lateral direction and resultant deviation of a shape of gate insulating film GTI from a shape as designed can be prevented. Removal of a part of insulating layer for the gate insulating film GIL by using floating gate FG as a mask does not have to be performed and insulating layer for the gate insulating film GIL shown in FIG. 23 may be used as gate insulating film GTI.

Figure 26:
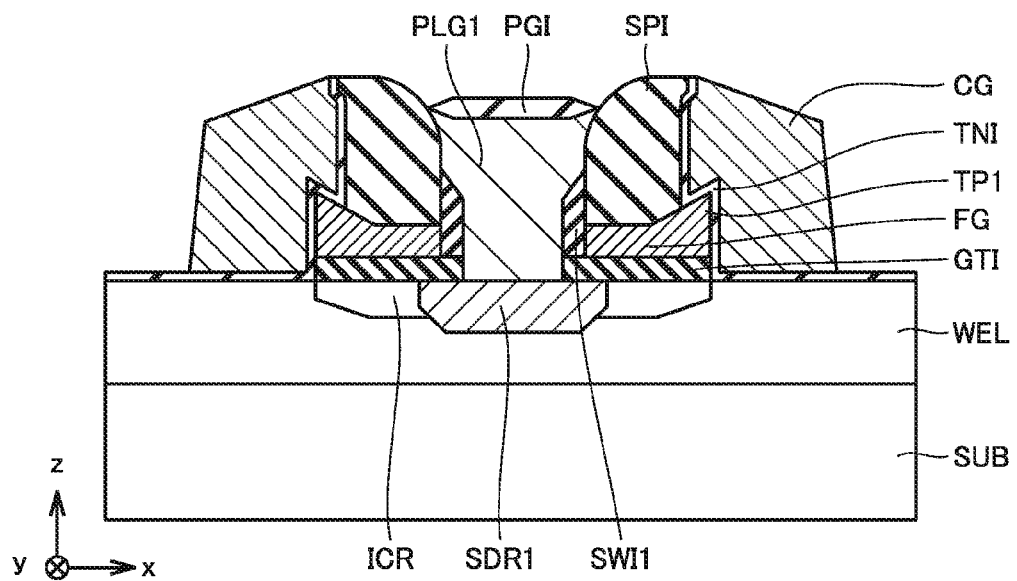
FIG. 26 is a schematic cross-sectional view showing a step following the step shown in FIG. 25, in the method of manufacturing a semiconductor device according to the first embodiment.

In succession, control gate CG is formed on first tip portion TP1 exposed from spacer insulating film SPI, with tunnel insulating film TNI being interposed. Specifically, referring to FIG. 25, tunnel insulating film TNI is formed on first tip portion TP1 of floating gate FG exposed from spacer insulating film SPI. Tunnel insulating film TNI may further be formed on principal surface PSF of semiconductor substrate SUB from which insulating layer for the gate insulating film GIL has been removed, on second FG side surface FGSF2 of floating gate FG opposite to first plug PLG1, and on the side surface of spacer insulating film SPI opposite to first plug PLG1. Tunnel insulating film TNI may be formed from a silicon oxide film. Referring to FIG. 26, control gate CG is formed on tunnel insulating film TNI. Specifically, control gate CG is formed on tunnel insulating film TNI opposed to first tip portion TP1 of floating gate FG, by etching back a conductive layer for the control gate on tunnel insulating film TNI, spacer insulating film SPI, and plug insulating film PGI. Control gate CG may further be formed on tunnel insulating film TNI in contact with principal surface PSF of semiconductor substrate SUB and on tunnel insulating film TNI in contact with spacer insulating film SPI. Control gate CG and the conductive layer for the control gate may be formed from a polysilicon film.

Figure 27:
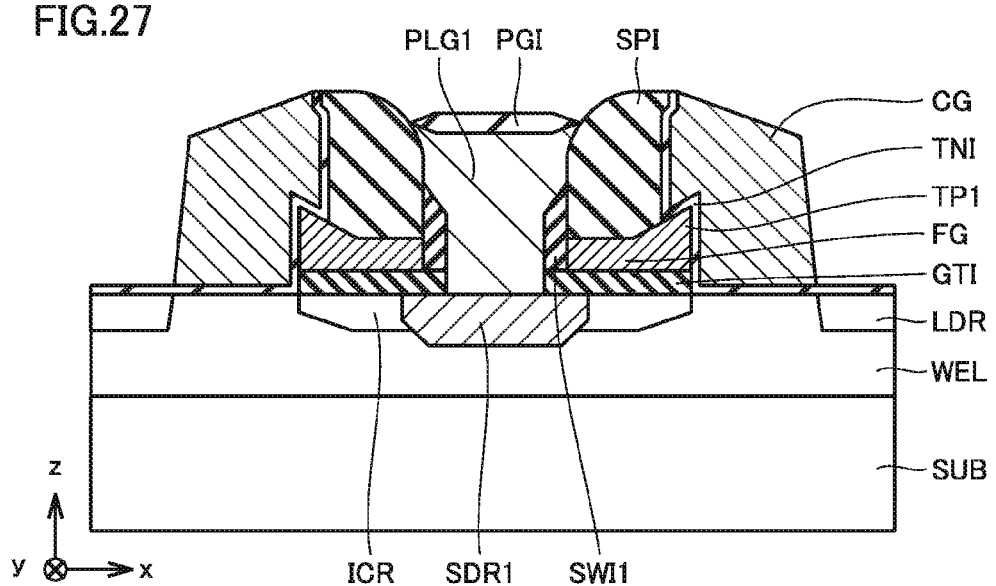
FIG. 27 is a schematic cross-sectional view showing a step following the step shown in FIG. 26, in the method of manufacturing a semiconductor device according to the first embodiment.

Referring to FIG. 27, LDD region LDR is formed in well WEL of semiconductor substrate SUB by implanting an impurity having the second conductivity type such as arsenic into principal surface PSF of semiconductor substrate SUB by using control gate CG, spacer insulating film SPI, and plug insulating film PGI as a mask.

Figure 28:
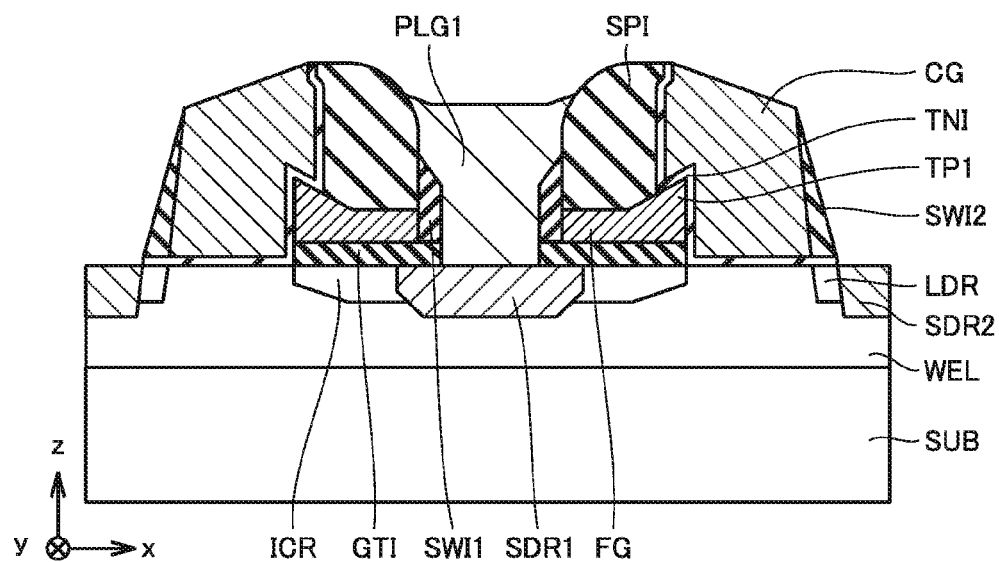
FIG. 28 is a schematic cross-sectional view showing a step following the step shown in FIG. 27, in the method of manufacturing a semiconductor device according to the first embodiment.

Referring to FIG. 28, second sidewall insulating film SWI2 is formed on a side surface of control gate CG opposite to floating gate FG. Specifically, an insulating layer for the second sidewall insulating film (not shown) is formed on control gate CG, spacer insulating film SPI, plug insulating film PGI, and tunnel insulating film TNI exposed from control gate CG. Then, second sidewall insulating film SWI2 is formed on the side surface of control gate CG opposite to floating gate FG by etching back the insulating layer for the second sidewall insulating film. Second sidewall insulating film SWI2 can be formed on the entire side surface or on most of the side surface of control gate CG by forming second sidewall insulating film SWI2 by etching back. Second sidewall insulating film SWI2 and the insulating layer for the second sidewall insulating film may be formed from a silicon oxide film. Plug insulating film PGI and tunnel insulating film TNI exposed from a side surface of second sidewall insulating film SWI2 may further be removed when the insulating layer for the second sidewall insulating film is etched back. In succession, second source/drain region SDR2 is formed in principal surface PSF of semiconductor substrate SUB exposed from second sidewall insulating film SWI2. Specifically, an impurity having the second conductivity type such as arsenic or phosphorus is implanted into principal surface PSF of semiconductor substrate SUB by using spacer insulating film SPI, control gate CG, and second sidewall insulating film SWI2 as a mask. Though a method of implanting an impurity having the second conductivity type into semiconductor substrate SUB is not particularly limited, it may be ion implantation. Second source/drain region SDR2 is thus formed in principal surface PSF of semiconductor substrate SUB exposed from second sidewall insulating film SWI2.

In succession, first silicide SLC1, second silicide SLC2, and third silicide SLC3 may be formed on a surface of second source/drain region SDR2, a surface of first plug PLG1, and a surface of control gate CG, respectively. First silicide SLC1, second silicide SLC2, and third silicide SLC3 may be formed from a $CoSi_x$ film. First silicide SLC1 is lower in electrical resistance than second source/drain region SDR2. Second silicide SLC2 is lower in electrical resistance than first plug PLG1. Third silicide SLC3 is lower in electrical resistance than control gate CG. First silicide SLC1 and third silicide SLC3 can electrically be isolated from each other by second sidewall insulating film SWI2 formed on the side surface of control gate CG.

Protection film PTC may be formed on first silicide SLC1, second silicide SLC2, third silicide SLC3, spacer insulating film SPI, and second sidewall insulating film SWI2. Protection film PTC covers a plurality of memory cells MC1. Therefore, protection film PTC electrically and mechanically protects the plurality of memory cells MC1. The plurality of memory cells MC1 can thus be manufactured.

A function and effect of the present embodiment will be described.

The method of manufacturing semiconductor device MCP according to the present embodiment includes a process below. A part of conductive layer for the floating gate FGL is removed by using spacer insulating film SPI, first insulating film ILF1, and second insulating film ILF2 as a mask. Thus, floating gate FG having a tip portion (first tip portion TP1) is formed from conductive layer for the floating gate FGL and a part of insulating layer for the gate insulating film GIL is exposed from floating gate FG. By selectively removing second insulating film ILF2 among second insulating film ILF2, insulating layer for the gate insulating film GIL, and spacer insulating film SPI, the tip portion (first tip portion TP1) of floating gate FG is further exposed. Therefore, variation in width of exposure of floating gate FG through spacer insulating film SPI can be suppressed. Variation in width w of the first tip portion opposed to control gate CG can be suppressed. Since second insulating film ILF2 is composed of a different material from insulating layer for the gate insulating film GIL, a difference between an etching rate for second insulating film ILF2 and an etching rate for insulating layer for the gate insulating film GIL can be increased. Substantially no insulating layer for the gate insulating film GIL is removed while second insulating film ILF2 is completely removed. Therefore, removal of insulating layer for the gate insulating film GIL under floating gate FG in the lateral direction and resultant deviation of a shape of gate insulating film GTI from the shape as designed can be prevented. Consequently, according to the method of manufacturing semiconductor device MCP according to the present embodiment, a semiconductor device having good characteristics without variation can be provided.

The method of manufacturing semiconductor device MCP according to the present embodiment may further include forming mask layer MSK having opening portion OPP on conductive layer for the floating gate FGL before spacer insulating film SPI, first insulating film ILF1, and second insulating film ILF2 are formed. Forming first insulating film ILF1 may include forming first insulating film ILF1 on the side surface of mask layer MSK facing opening portion OPP. Since mask layer MSK supports first insulating film ILF1, first insulating film ILF1 having a large height and small thickness $d_1$ can be formed on conductive layer for the floating gate FGL in a stable manner.

In the method of manufacturing semiconductor device MCP according to the present embodiment, forming first insulating film ILF1 may include forming first insulating layer ILL1 in opening portion OPP of mask layer MSK and on mask layer MSK and etching back first insulating layer ILL1. Therefore, first insulating film ILF1 having a large height and small thickness $d_1$ can be formed on conductive layer for the floating gate FGL in a stable manner.

In the method of manufacturing semiconductor device MCP according to the present embodiment, forming second insulating film ILF2 may include forming second insulating layer ILL2 in opening portion OPP of mask layer MSK, on mask layer MSK, and on first insulating film ILF1 and etching back second insulating layer ILL2. Therefore, second insulating film ILF2 having a large height and a small width can be formed on conductive layer for the floating gate FGL and on the side surface of first insulating film ILF1 in a stable manner.

In the method of manufacturing semiconductor device MCP according to the present embodiment, forming spacer insulating film SPI may include forming insulating layer for the spacer insulating film SPIIL in opening portion OPP of mask layer MSK, on mask layer MSK, on first insulating film ILF1, and on second insulating film ILF2 and etching back insulating layer for the spacer insulating film SPIIL. Therefore, spacer insulating film SPI having a large height can be formed on conductive layer for the floating gate FGL and the side surface of second insulating film ILF2 in a stable manner.

The method of manufacturing semiconductor device MCP according to the present embodiment may further include forming slanted portion SLT in conductive layer for the floating gate FGL. First insulating film ILF1 and second insulating film ILF2 may be formed on slanted portion SLT of conductive layer for the floating gate FGL. Therefore, variation in width w of the tip portion (first tip portion TP1) opposed to control gate CG can be suppressed. Consequently, according to the method of manufacturing semiconductor device MCP according to the present embodiment, a semiconductor device having good characteristics without variation can be provided.

The method of manufacturing semiconductor device MCP according to the present embodiment may further include forming mask layer MSK having opening portion OPP on conductive layer for the floating gate FGL before spacer insulating film SPI, first insulating film ILF1, and second insulating film ILF2 are formed. Forming slanted portion SLT may include removing a part of the upper surface of conductive layer for the floating gate FGL by using mask layer MSK having opening portion OPP. Mask layer MSK having opening portion OPP may be used in forming slanted portion SLT and forming first insulating film ILF1. According to the method of manufacturing semiconductor device MCP according to the present embodiment, the method of manufacturing semiconductor device MCP can be simplified with the number of times of formation of mask layer MSK being decreased.

In the method of manufacturing semiconductor device MCP according to the present embodiment, first insulating film ILF1 may be smaller in thickness than insulating layer for the gate insulating film GIL. Therefore, removal of insulating layer for the gate insulating film GIL under floating gate FG in the lateral direction at the time when first insulating film ILF1 is completely removed can more reliably be prevented. Consequently, according to the method of manufacturing semiconductor device MCP according to the present embodiment, a semiconductor device having good characteristics without variation can be provided.

The method of manufacturing semiconductor device MCP according to the present embodiment may further include forming gate insulating film GTI by removing a part of insulating layer for the gate insulating film GIL by using floating gate FG as a mask after second insulating film ILF2 is selectively removed. In selectively removing second insulating film ILF2, variation in width of exposure of floating gate FG through spacer insulating film SPI has already been suppressed. Therefore, insulating layer for the gate insulating film GIL exposed from floating gate FG can be removed without taking into account a width of exposure of floating gate FG through spacer insulating film SPI. Consequently, removal of insulating layer for the gate insulating film GIL under floating gate FG in the lateral direction and resultant deviation of a shape of gate insulating film GTI from a shape as designed can be prevented. According to the method of manufacturing semiconductor device MCP according to the present embodiment, a semiconductor device having good characteristics without variation can more reliably be provided.

The method of manufacturing semiconductor device MCP according to the present embodiment may further include forming first source/drain region SDR1 in semiconductor substrate SUB and forming second source/drain region SDR2 in semiconductor substrate SUB. According to the method of manufacturing semiconductor device MCP according to the present embodiment, a semiconductor device having good characteristics without variation can be provided.

Second Embodiment

Figure 29:
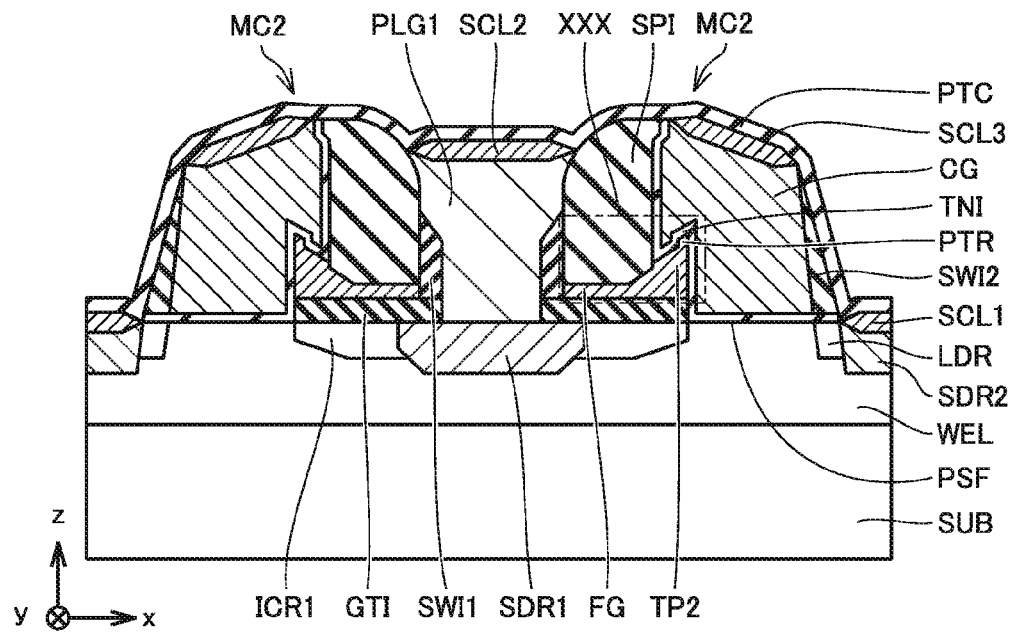
FIG. 29 is a schematic cross-sectional view of a semiconductor device according to the second embodiment.
Figure 30:
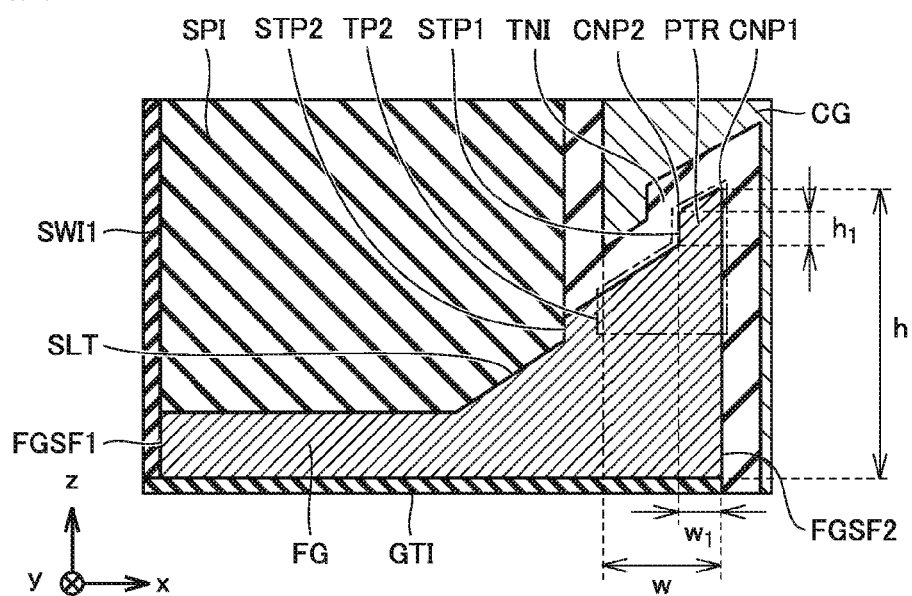
FIG. 30 is a partially enlarged schematic cross-sectional view of a portion XXX in FIG. 29, in the semiconductor device according to the second embodiment.
Figure 31:
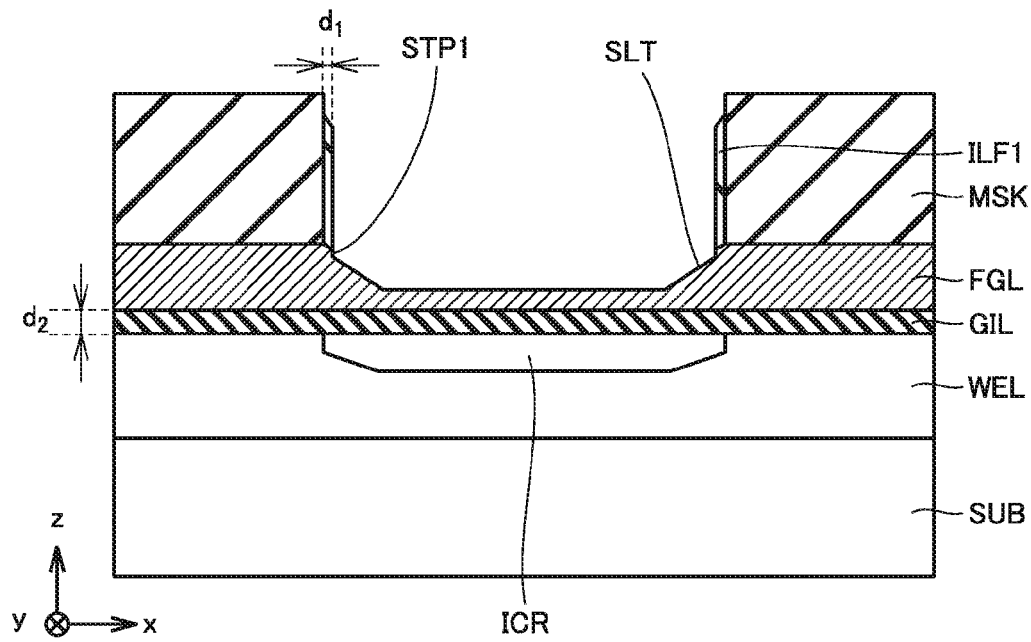
FIG. 31 is a schematic cross-sectional view showing a step following the step shown in FIG. 9, in the method of manufacturing a semiconductor device according to the second embodiment.

A configuration of a memory cell MC2 included in non-volatile memory area NVM of semiconductor device MCP in the present embodiment will be described with reference to FIGS. 29 and 30. Memory cell MC2 shown in FIGS. 29 and 30 is similar in configuration to memory cell MC1 shown in FIGS. 3 and 4, and different therefrom in the following. Since memory cell MC2 shown in FIGS. 29 and 30 is similar in configuration to memory cell MC1 shown in FIGS. 3 and 4, the same elements have the same references allotted and description thereof will not be repeated.

Figure 3:
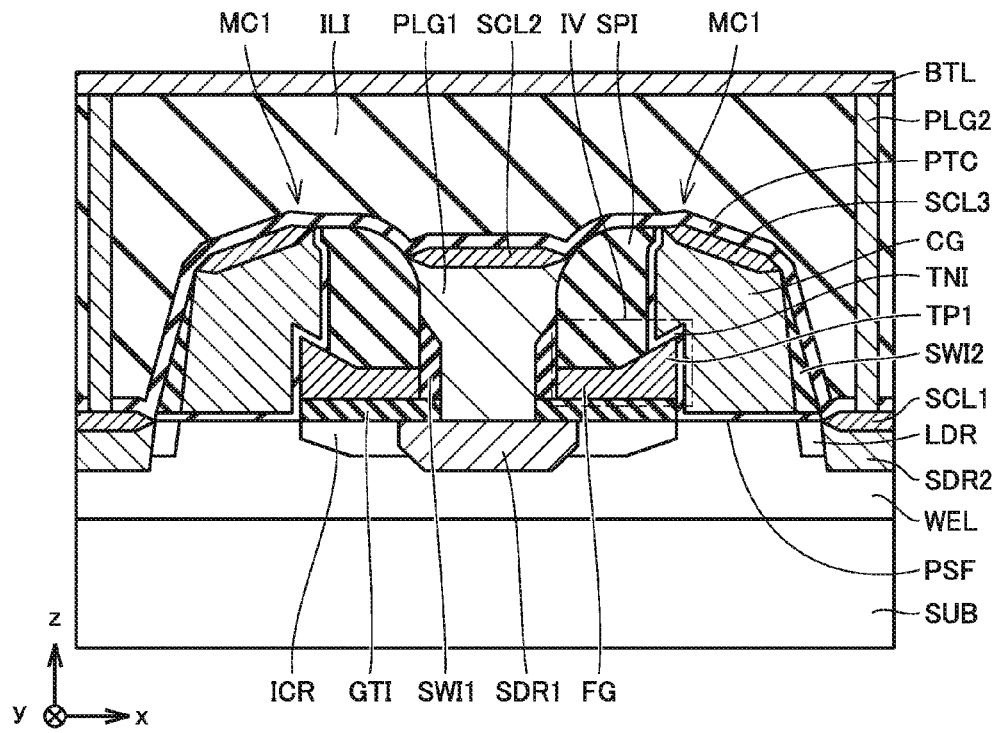
FIG. 3 is a schematic cross-sectional view of the semiconductor device according to the first embodiment, along the line III-III shown in FIG. 2.

Memory cell MC2 shown in FIGS. 29 and 30 is different from memory cell MC1 shown in FIGS. 3 and 4 in structure of floating gate FG. Floating gate FG in memory cell MC2 shown in FIGS. 29 and 30 has a second tip portion TP2 opposed to control gate CG with tunnel insulating film TNI being interposed. Second tip portion TP2 has width w along the first direction (for example, the x direction). Second tip portion TP2 is opposed to control gate CG over width w of second tip portion TP2. Inclined portion SLT provided in the upper surface of floating gate FG has a first step portion STP1. First step portion STP1 is located in second tip portion TP2. Inclined portion SLT provided in the upper surface of floating gate FG may further have a second step portion STP2. Second step portion STP2 may be located on a side of first FG side surface FGSF1 relative to first step portion STP1. In the present embodiment, second step portion STP2 is located on the side of first FG side surface FGSF1 relative to second tip portion TP2 of floating gate FG. Second step portion STP2 does not have to be provided in one modification of the present embodiment. In another modification of the present embodiment, second step portion STP2 may be located in second tip portion TP2 opposed to control gate CG.

Second tip portion TP2 has a plurality of projecting corner portions (first corner portion CNP1 and a second corner portion CNP2). Erasing electric field applied across floating gate FG and control gate CG in the erasing operation of memory cell MC2 is particularly concentrated to the plurality of projecting corner portions (first corner portion CNP1 and second corner portion CNP2). Second tip portion TP2 in the present embodiment has a greater number of projecting corner portions than first tip portion TP1 in the first embodiment. Therefore, electrons held in floating gate FG can further efficiently be extracted to control gate CG and the erasing speed of memory cell MC2 can be higher.

Second tip portion TP2 has at least one protruding portion PTR. At least one of protruding portions PTR may have a plurality of projecting corner portions (first corner portion CNP1 and second corner portion CNP2). Protruding portion PTR may be provided between second FG side surface FGSF2 and first step portion STP1. A width $w_1$ of protruding portion PTR, which is a length of protruding portion PTR in the first direction (for example, the x direction), may be not greater than 50%, preferably not greater than 40%, and further preferably not greater than 30% of width w of second tip portion TP2 opposed to control gate CG. With width $w_1$ of protruding portion PTR being not greater than 50%, preferably not greater than 40%, and further preferably not greater than 30% of width w of second tip portion TP2, erasing electric field applied across floating gate FG and control gate CG in the erasing operation of memory cell MC2 can be concentrated to protruding portion PTR.

A height $h_1$ of protruding portion PTR may be not smaller than 5% and preferably not smaller than 10% of height h of floating gate FG. With height $h_1$ of protruding portion PTR being not smaller than 5% and preferably not smaller than 10% of height h of floating gate FG, a surface area of floating gate FG opposed to control gate CG can be increased. Height $h_1$ of protruding portion PTR represents a minimum height of protruding portion PTR. In the present embodiment, height $h_1$ of protruding portion PTR represents a height of first step portion STP1. Height h of floating gate FG represents a maximum height of floating gate FG. In the present embodiment, height h of floating gate FG represents a thickness of floating gate FG (a length in the third direction (for example, the z direction)) in second FG side surface FGSF2 of floating gate FG.

A method of manufacturing memory cell MC2 included in non-volatile memory area NVM of semiconductor device MCP in the present embodiment will be described with reference to FIGS. 6 to 9 and 31 to 39.

The method of manufacturing memory cell MC2 in the present embodiment includes the process for manufacturing a memory cell in the first embodiment shown in FIGS. 6 to 9. In succession, referring to FIG. 31, first insulating film ILF1 is formed on the side surface of mask layer MSK facing opening portion OPP and slanted portion SLT of conductive layer for the floating gate FGL by etching back first insulating layer for the first insulating film ILL1. When first insulating layer for the first insulating film ILL1 is etched back, a part of the upper surface of conductive layer for the floating gate FGL exposed from first insulating film ILF1 is further removed. First step portion STP1 is thus formed in the upper surface of slanted portion SLT of conductive layer for the floating gate FGL exposed from first insulating film ILF1. In the present embodiment as well, thickness $d_1$ of first insulating film ILF1 (a length in the first direction (for example, the x direction)) may be smaller than thickness $d_2$ of insulating layer for the gate insulating film GIL (a length in the third direction (for example, the z direction)).

Figure 32:
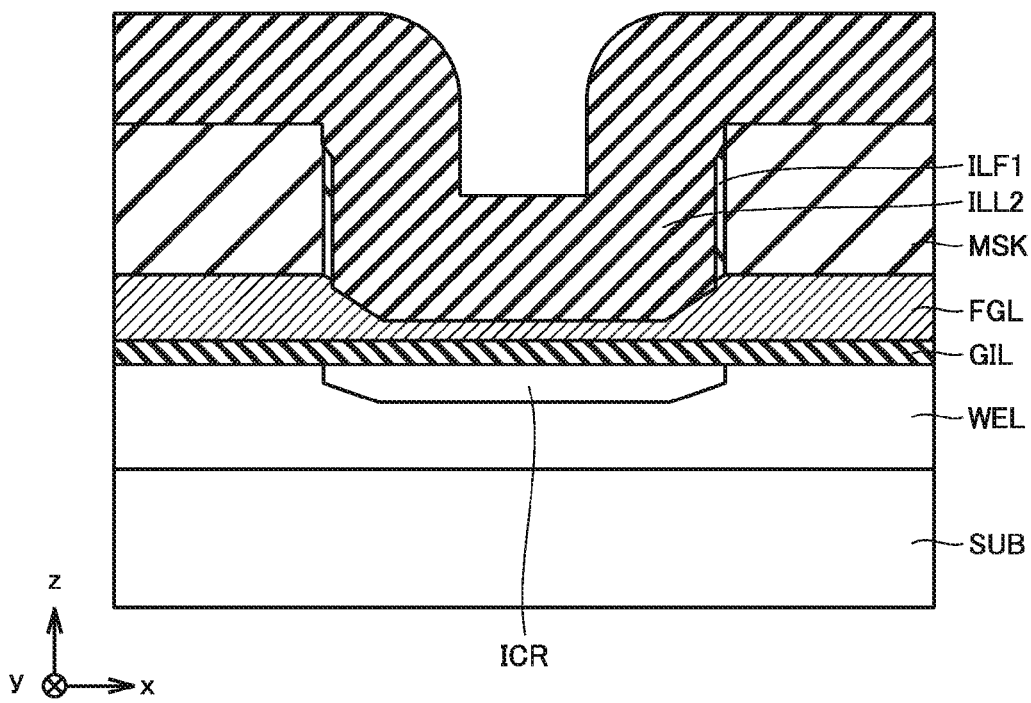
FIG. 32 is a schematic cross-sectional view showing a step following the step shown in FIG. 31, in the method of manufacturing a semiconductor device according to the second embodiment.
Figure 33:
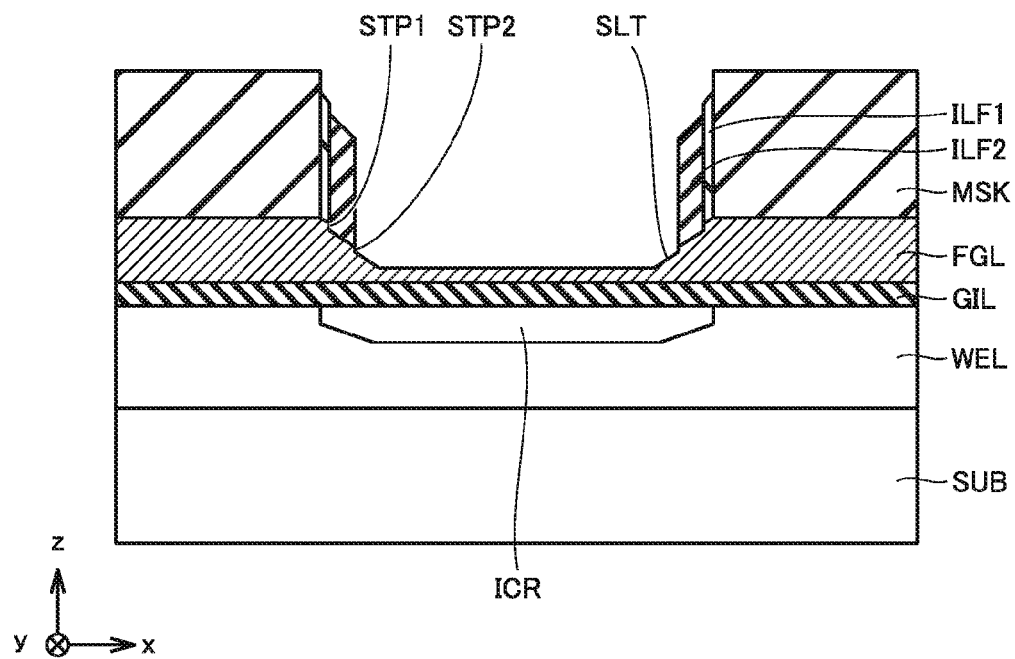
FIG. 33 is a schematic cross-sectional view showing a step following the step shown in FIG. 32, in the method of manufacturing a semiconductor device according to the second embodiment.

Referring to FIGS. 32 and 33, second insulating film ILF2 is formed on the side surface of first insulating film ILF1 and slanted portion SLT of conductive layer for the floating gate FGL. Specifically, referring to FIG. 32, second insulating layer for the second insulating film ILL2 is formed in opening portion OPP of mask layer MSK, on mask layer MSK, and on first insulating film ILF1. In succession, referring to FIG. 33, second insulating film ILF2 is formed on the side surface of first insulating film ILF1 and slanted portion SLT of conductive layer for the floating gate FGL by etching back second insulating layer for the second insulating film ILL2. A part of the upper surface of conductive layer for the floating gate FGL exposed from second insulating film ILF2 is further removed at the time when second insulating layer for the second insulating film ILL2 is etched back. Second step portion STP2 is thus formed in the upper surface of slanted portion SLT of conductive layer for the floating gate FGL exposed from second insulating film ILF2. Second insulating film ILF2 and second insulating layer for the second insulating film ILL2 are composed of a different material from spacer insulating film SPI and insulating layer for the gate insulating film GIL such as a silicon nitride (SiN) film, a silicon oxynitride (SiON) film, or a silicon carbonitride (SiCN) film. In one modification of the present embodiment in which second step portion STP2 is not provided, second step portion STP2 is not formed when second insulating layer for the second insulating film ILL2 is removed.

Figure 34:
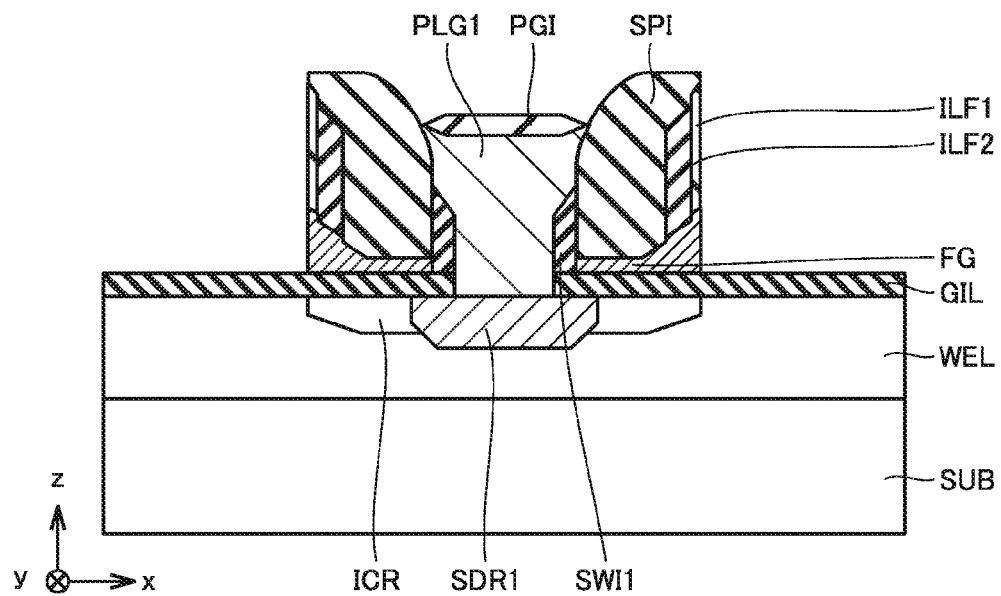
FIG. 34 is a schematic cross-sectional view showing one step in FIG. 32 or later, in the method of manufacturing a semiconductor device according to the second embodiment.

In succession, floating gate FG is formed from conductive layer for the floating gate FGL and a part of insulating layer for the gate insulating film GIL is exposed from floating gate FG as shown in FIG. 34, through the process substantially the same as in FIGS. 13 to 21.

Figure 35:
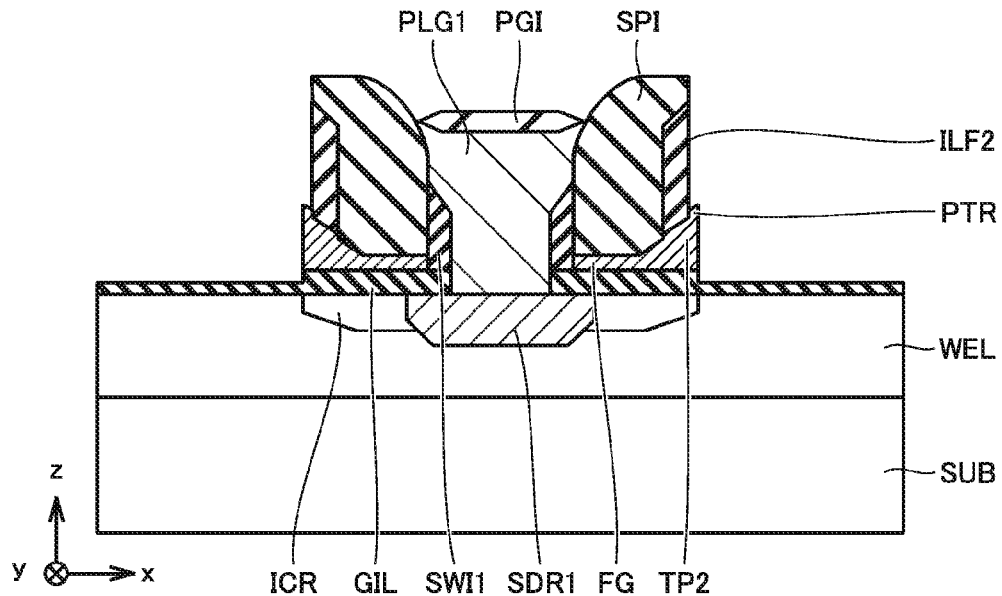
FIG. 35 is a schematic cross-sectional view showing a step following the step shown in FIG. 34, in the method of manufacturing a semiconductor device according to the second embodiment.

Referring to FIG. 35, protruding portion PTR in first tip portion TP1 of floating gate FG is exposed by removing first insulating film ILF1. Specifically, a part of first tip portion TP1 of floating gate FG is exposed by selectively removing first insulating film ILF1, of first insulating film ILF1 and second insulating film ILF2. Since second insulating film ILF2 is different from first insulating film ILF1 in material, an etching rate for second insulating film ILF2 can be lower than an etching rate for first insulating film ILF1. Therefore, first insulating film ILF1 may selectively be removed with second insulating film ILF2 functioning as an etch stop film. A part of insulating layer for the gate insulating film GIL may also be removed at the time when first insulating film ILF1 is removed. Thickness (a length in the first direction (for example, the x direction)) $d_1$ of first insulating film ILF1 may be smaller than thickness $d_2$ (a length in the third direction (for example, the z direction)) of insulating layer for the gate insulating film GIL. Therefore, removal of insulating layer for the gate insulating film GIL under floating gate FG in the lateral direction at the time when first insulating film ILF1 is completely removed can more reliably be prevented.

Figure 36:
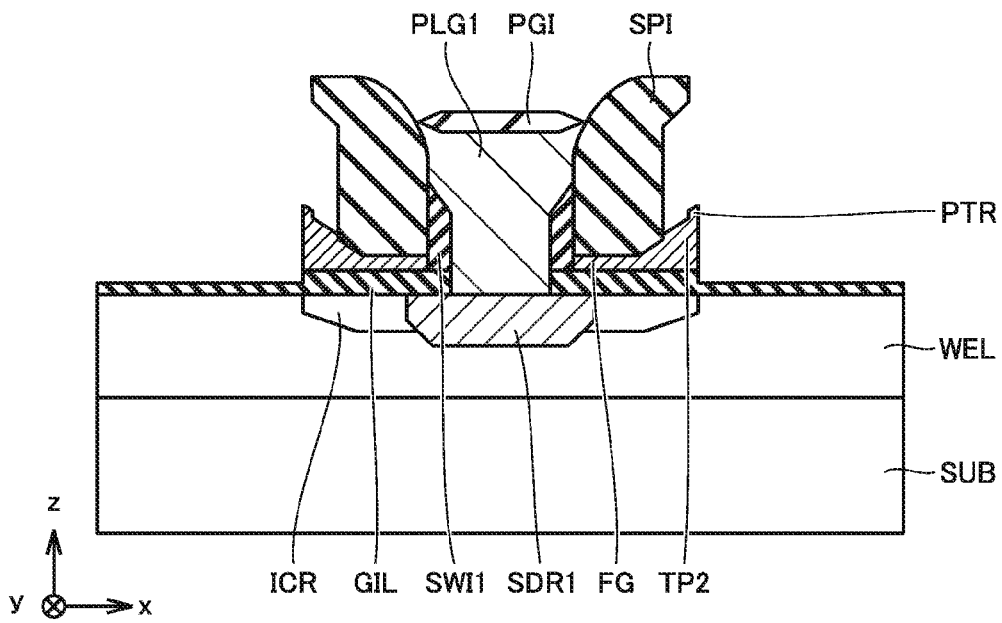
FIG. 36 is a schematic cross-sectional view showing a step following the step shown in FIG. 35, in the method of manufacturing a semiconductor device according to the second embodiment.

Referring to FIG. 36, first tip portion TP1 of floating gate FG is further exposed by selectively removing second insulating film ILF2 among second insulating film ILF2, insulating layer for the gate insulating film GIL, and spacer insulating film SPI. Specifically, first step portion STP1 of floating gate FG and slanted portion SLT adjacent to first step portion STP1 are exposed. Since second insulating film ILF2 is different from spacer insulating film SPI in material, an etching rate for spacer insulating film SPI can be much lower than an etching rate for second insulating film ILF2. Therefore, second insulating film ILF2 can selectively be removed with spacer insulating film SPI functioning as an etch stop film. Variation in width of exposure of floating gate FG through spacer insulating film SPI can be suppressed by completely removing second insulating film ILF2. Since second insulating film ILF2 is different from insulating layer for the gate insulating film GIL in material, an etching rate for insulating layer for the gate insulating film GIL can be much lower than an etching rate for second insulating film ILF2. Substantially no insulating layer for the gate insulating film GIL is removed while second insulating film ILF2 is completely removed. Therefore, removal of insulating layer for the gate insulating film GIL under floating gate FG in the lateral direction can be prevented.

Figure 37:
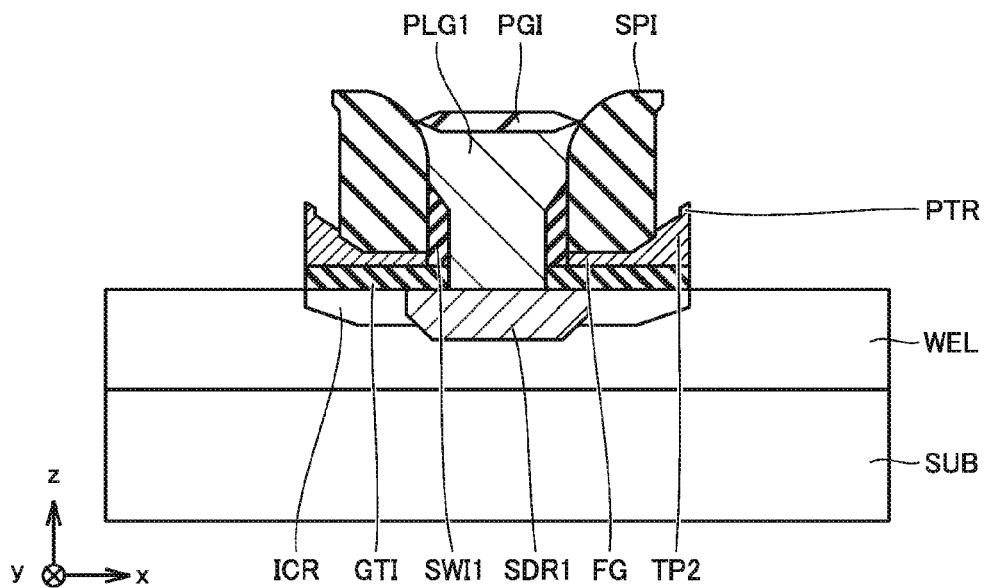
FIG. 37 is a schematic cross-sectional view showing a step following the step shown in FIG. 36, in the method of manufacturing a semiconductor device according to the second embodiment.

Referring to FIG. 37, gate insulating film GTI may be formed by removing a part of insulating layer for the gate insulating film GIL by using floating gate FG as a mask. Removal of a part of insulating layer for the gate insulating film GIL shown in FIG. 37 is substantially the same as removal of a part of insulating layer for the gate insulating film GIL shown in FIG. 24. Removal of a part of insulating layer for the gate insulating film GIL by using floating gate FG as a mask does not have to be performed and insulating layer for the gate insulating film GIL shown in FIG. 36 may be used as gate insulating film GTI.

Figure 38:
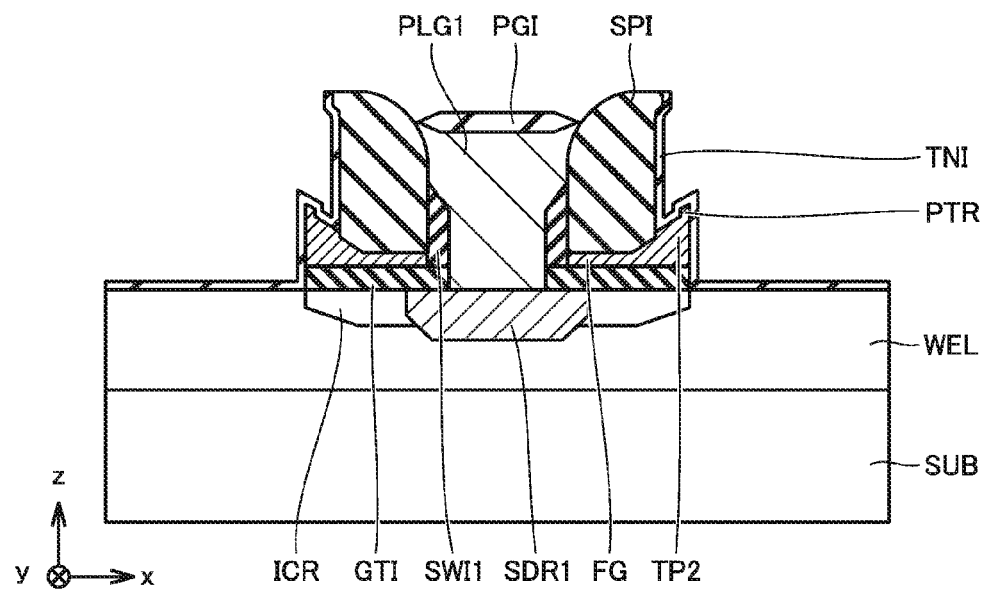
FIG. 38 is a schematic cross-sectional view showing a step following the step shown in FIG. 37, in the method of manufacturing a semiconductor device according to the second embodiment.
Figure 39:
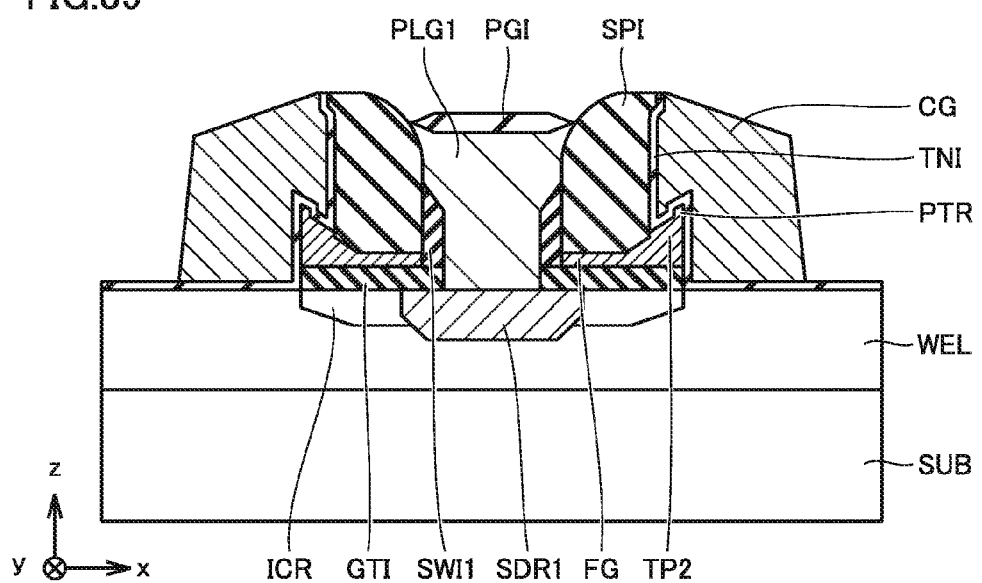
FIG. 39 is a schematic cross-sectional view showing a step following the step shown in FIG. 38, in the method of manufacturing a semiconductor device according to the second embodiment.

Referring to FIGS. 38 and 39, control gate CG is formed on second tip portion TP2 exposed from spacer insulating film SPI with tunnel insulating film TNI being interposed. Formation of tunnel insulating film TNI shown in FIG. 38 is substantially the same as formation of tunnel insulating film TNI shown in FIG. 25. Formation of control gate CG shown in FIG. 39 is substantially the same as formation of control gate CG shown in FIG. 26. In succession, a plurality of memory cells MC2 in the present embodiment shown in FIGS. 29 and 30 can be manufactured through the process substantially the same as the process shown in FIG. 27, the process shown in FIG. 28, and the process after the process shown in FIG. 28.

A method below can be exemplified as a method of manufacturing a semiconductor device in another modification of the present embodiment in which second step portion STP2 is located in second tip portion TP2 opposed to control gate CG. One manufacturing method may include exposing second step portion STP2 through spacer insulating film SPI by removing a part of spacer insulating film SPI in removing insulating layer for the gate insulating film GIL exposed from floating gate FG shown in FIG. 37. Another manufacturing method may include providing a third insulating film composed of a different material from second insulating film ILF2 between spacer insulating film SPI and second insulating film ILF2, selectively removing second insulating film ILF2 out of second insulating film ILF2 and the third insulating film and forming second step portion STP2 in slanted portion SLT of floating gate FG, removing the third insulating film, and forming a control gate with a tunnel insulating film being interposed after the third insulating film is removed. With such a manufacturing method, second step portion STP2 can be located in second tip portion TP2 opposed to control gate CG. According to the method of manufacturing a semiconductor device in another modification of the present embodiment, second tip portion TP2 having a plurality of protruding portions PTR and a greater number of projecting corner portions can be manufactured.

A function and effect of the present embodiment will be described. The present embodiment achieves the function and effect the same as in the first embodiment and further achieves a function and effect below.

In semiconductor device MCP according to the present embodiment, the tip portion (second tip portion TP2) opposed to control gate CG has a plurality of projecting corner portions (first corner portion CNP1 and second corner portion CNP2). Erasing electric field applied across floating gate FG and control gate CG in the erasing operation of memory cell MC2 is particularly concentrated to the plurality of projecting corner portions (first corner portion CNP1 and second corner portion CNP2). The present embodiment is greater in number of projecting corner portions to which erasing electric field is concentrated than the first embodiment. Therefore, according to semiconductor device MCP according to the present embodiment, electrons held in floating gate FG can further efficiently be extracted to control gate CG and the erasing speed of memory cell MC2 can be increased.

In semiconductor device MCP according to the present embodiment, the tip portion (second tip portion TP2) may have at least one protruding portion PTR. At least one of protruding portions PTR may have a plurality of projecting corner portions (first corner portion CNP1 and second corner portion CNP2). Erasing electric field applied across floating gate FG and control gate CG in the erasing operation of memory cell MC2 can be concentrated to protruding portion PTR. Therefore, according to semiconductor device MCP according to the present embodiment, electrons held in floating gate FG can further efficiently be extracted to control gate CG and the erasing speed of memory cell MC2 can be increased.

In semiconductor device MCP according to the present embodiment, width $w_1$ of protruding portion PTR may be not greater than 50% of width w of the tip portion (second tip portion TP2). Erasing electric field applied across floating gate FG and control gate CG in the erasing operation of memory cell MC2 can be concentrated to protruding portion PTR. Therefore, according to semiconductor device MCP according to the present embodiment, electrons held in floating gate FG can further efficiently be extracted to control gate CG and the erasing speed of memory cell MC2 can be increased.

In semiconductor device MCP according to the present embodiment, height $h_1$ of protruding portion PTR may be not smaller than 5% of height h of floating gate FG. Since height $h_1$ of protruding portion PTR is not smaller than 5% of height h of floating gate FG, a surface area of floating gate FG opposed to control gate CG can be increased. Therefore, according to semiconductor device MCP according to the present embodiment, electrons held in floating gate FG can further efficiently be extracted to control gate CG and the erasing speed of memory cell MC2 can be increased.

The method of manufacturing semiconductor device MCP according to the present embodiment may further include forming first step portion STP1 in the upper surface of conductive layer for the floating gate FGL by removing a part of the upper surface of conductive layer for the floating gate FGL by using first insulating film ILF1 as a mask before second insulating film ILF2 is formed. By forming first step portion STP1 in the upper surface of conductive layer for the floating gate FGL, at least one protruding portion PTR can be formed in the tip portion (second tip portion TP2). Erasing electric field applied across floating gate FG and control gate CG in the erasing operation of memory cell MC2 can be concentrated to protruding portion PTR. Therefore, according to the method of manufacturing semiconductor device MCP according to the present embodiment, a semiconductor device in which the erasing speed of memory cell MC2 is improved can be manufactured.

The method of manufacturing semiconductor device MCP according to the present embodiment may further include forming second step portion STP2 in the upper surface of conductive layer for the floating gate FGL by removing a part of the upper surface of conductive layer for the floating gate FGL by using second insulating film ILF2 as a mask before spacer insulating film SPI is formed. Therefore, a plurality of protruding portions PTR and a greater number of corner portions can be formed in the tip portion (second tip portion TP2) opposed to control gate CG. Therefore, according to the method of manufacturing semiconductor device MCP according to the present embodiment, a semiconductor device in which the erasing speed of memory cell MC2 is further improved can be manufactured.

Though the invention made by the present inventor has specifically been described above based on the embodiments, the present invention is not limited to the embodiments, but can naturally be modified variously within the scope not departing from the gist thereof.

What is claimed is:

1. A semiconductor device comprising:
   a semiconductor substrate having a principal surface;
   a floating gate provided on the principal surface of the semiconductor substrate and having a tip portion;
   a spacer insulating film provided on the floating gate;
   a tunnel insulating film provided on the tip portion of the floating gate; and
   a control gate provided on the tunnel insulating film,
   the tip portion being exposed from the spacer insulating film and opposed to the control gate with the tunnel insulating film being interposed, and
   the tip portion having a plurality of projecting corner portions;
   wherein the tip portion has at least one protruding portion, and at least one of the protruding portions has the plurality of projecting corner portions.

2. The semiconductor device according to claim 1, wherein the protruding portion has a width at most 50% of a width of the tip portion.

3. The semiconductor device according to claim 1, wherein the protruding portion has a height at least 5% of a height of the floating gate.

* * * * *